(12) United States Patent
Ishikawa et al.

(10) Patent No.: US 7,590,016 B2
(45) Date of Patent: Sep. 15, 2009

(54) INTEGRATED CIRCUIT

(75) Inventors: Katsuya Ishikawa, Kawasaki (JP);
Tatsushi Otsuka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/785,630

(22) Filed: Apr. 19, 2007

(65) Prior Publication Data
US 2008/0043552 A1 Feb. 21, 2008

(30) Foreign Application Priority Data
Aug. 18, 2006 (JP) .............................. 2006-223281

(51) Int. Cl.
*G11C 7/00* (2006.01)
*G11C 8/00* (2006.01)
(52) U.S. Cl. ................ 365/201; 365/189.05; 365/233.1; 365/233.11; 365/233.13; 365/233.19; 365/233.5
(58) Field of Classification Search ................. 365/201, 365/233.1, 233.11, 233.12, 233.16, 233.17, 365/233.19, 189.05, 233.5, 233.13
See application file for complete search history.

(56) References Cited

U.S. PATENT DOCUMENTS

| 5,046,049 | A  | * | 9/1991  | Choi et al. ................. 365/201 |
| 6,182,253 | B1 | * | 1/2001  | Lawrence et al. ........... 365/201 |
| 6,246,618 | B1 | * | 6/2001  | Yamamoto et al. .......... 365/201 |
| 6,404,684 | B2 |   | 6/2002  | Arimoto et al. |
| 6,658,611 | B1 | * | 12/2003 | Jun ............................ 365/201 |
| 6,675,329 | B1 | * | 1/2004  | Im .............................. 365/201 |
| 7,038,955 | B2 | * | 5/2006  | Susuki et al. ................ 365/201 |
| 7,149,136 | B2 | * | 12/2006 | Tanishima et al. .......... 365/201 |
| 7,168,017 | B2 | * | 1/2007  | Kim et al. .................... 365/201 |
| 7,228,470 | B2 | * | 6/2007  | Saito ........................... 365/201 |
| 7,325,176 | B2 | * | 1/2008  | Larson et al. ............... 365/201 |
| 7,325,178 | B2 | * | 1/2008  | Damodaran et al. ......... 365/201 |

FOREIGN PATENT DOCUMENTS

| JP | 05-066249   | 3/1993 |
| JP | 06-003424   | 1/1994 |
| JP | 2003-004809 | 1/2003 |

\* cited by examiner

*Primary Examiner*—Trong Phan
(74) *Attorney, Agent, or Firm*—Fujitsu Patent Center

(57) ABSTRACT

An integrated circuit that enables a reduction in chip size and test time. This integrated circuit comprises an internal circuit; an external memory control circuit for inputting read data from an LSI tester by the use of a read command and for outputting write data to the LSI tester by the use of a write command; a test RAM including a read data storage section for storing the read data inputted from the LSI tester at a low speed and a write data storage section for storing the write data outputted from the control circuit; a test circuit for interpreting the read command and the write command issued by the external memory control circuit, for supplying, at the time of determining that the read data must be inputted to the external memory control circuit, the read data from the test RAM to the external memory control circuit at a high speed, and for supplying, at the time of determining that the write data is outputted from the external memory control circuit, the write data outputted from the external memory control circuit to the test RAM at a high speed; and a test circuit for outputting the write data stored in the test RAM to the LSI tester at a low speed.

12 Claims, 28 Drawing Sheets

INTEGRATED CIRCUIT

CROSS-REFERENCE TO RELATED APPLICATIONS

This application is based upon and claims the benefits of priority from the prior Japanese Patent Application No. 2006-223281, filed on Aug. 18, 2006, the entire contents of which are incorporated herein by reference.

BACKGROUND OF THE INVENTION (1) Field of the Invention

This invention relates to an integrated circuit and, more particularly, to an integrated circuit capable of verifying the operation speed of a circuit.

(2) Description of the Related Art

In recent years there have been many cases where an ordinary semiconductor integrated circuit to which a high-speed random access memory (RAM) is externally connected is used. The high-speed RAM is a RAM in which a data input-output rate is higher than the rate of an ordinary semiconductor tester, or a RAM the operation speed of which is so high that data which is outputted from the semiconductor integrated circuit and which is synchronized with a clock cannot be inputted from a semiconductor tester because of process variation.

There are various known methods for testing such a high-speed RAM (see, for example, Japanese Patent Laid-Open Publication No. 2003-4809).

FIG. 27 is a block diagram showing a conventional system for testing a semiconductor integrated circuit.

A semiconductor integrated circuit 90 includes an internal circuit 91 to be measured, storage circuits 92 and 93 connected to input and output sides, respectively, of the internal circuit 91, a buffer 94 for inputting a low-speed test pattern, a buffer 95 for outputting the low-speed test pattern, input terminals 96 of large-scale integration (LSI) where various signals are inputted from the outside, output terminals 97 where expected output values are outputted to the outside, and an oscillation circuit 98, such as a phase locked loop (PLL), for generating a high-speed clock signal by multiplying a low-speed clock signal.

In FIG. 27, the storage circuits 92 and 93 store data every clock during a test period by the operation of the oscillation circuit 98. Accordingly, the maximum number of test patterns from the start to stopping of the operation of the oscillation circuit 98 is limited by the capacity of the storage circuits 92 and 93. The number of test patterns is large, so the process "input data to storage circuit→lock up oscillation circuit→perform high-speed test→output data from storage circuit" must be repeated more than once.

FIG. 28 shows waveforms indicative of the operation of the conventional system.

When a test mode is data input, the storage circuit 92 is written at a low speed. When the test mode is lockup, the oscillation circuit 98 is made to operate, and is waited for to stabilize. When the test mode is a high-speed test, data stored in the storage circuit 92 is inputted and a high-speed test is performed with the storage circuit 93 as a destination to which data is outputted. When the test mode is data input-output, data to be used in the next test is written to the storage circuit 92 at a low speed and data stored in the storage circuit 93 is outputted to the outside at a low speed.

With such a test system, however, the following problems arise. To perform a troublesome test such as a test in which an animation is encoded or decoded, it is necessary to input about several megabytes of data to the storage circuit 92 and to output about several megabytes of data from the storage circuit 93. In this case, RAMs having very large capacity must be used as the storage circuits 92 and 93. Alternatively, a test must be performed plural times by using RAMs each having a capacity of several kilobytes to several tens of kilobytes. If a test is performed plural times, the state of the internal circuit 91 must be held while the oscillation circuit 98 is at a stop. In addition, the storage circuits 92 and 93 also store meaningless data, that is to say, write data which exists at the time of write enable not being asserted, read data which exists at the time of data not being needed by the internal circuit 91, and the like. As a result, storage capacity wasted increases and time is wasted in inputting unnecessary data and outputting and determining meaningless data. Therefore, the size of an integrated circuit chip increases and test time lengthens.

SUMMARY OF THE INVENTION

The present invention was made under the background circumstances described above. An object of the present invention is to provide an integrated circuit that enables a reduction in chip size and test time.

In order to achieve the above object, an integrated circuit capable of verifying the operation speed of a circuit is provided. This integrated circuit comprises an internal circuit to be tested, a control circuit located between the internal circuit and an external device for inputting read data inputted to the internal circuit from the external device by the use of a read command and for outputting write data outputted from the internal circuit to the external device by the use of a write command, a test storage section including a read data storage section for storing the read data inputted at a low speed and a write data storage section for storing the write data outputted from the control circuit, a command interpretation circuit for interpreting the read command and the write command issued from the control circuit, for supplying, at the time of determining that the read data must be inputted to the control circuit, the read data from the test storage section to the control circuit at a high speed, and for supplying, at the time of determining that the write data is outputted from the control circuit, the write data outputted from the control circuit to the test storage section at a high speed, an input circuit for inputting the read data inputted from the external device to the test storage section at a low speed, and an output circuit for outputting the write data supplied to the test storage section to the external device at a low speed.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1:
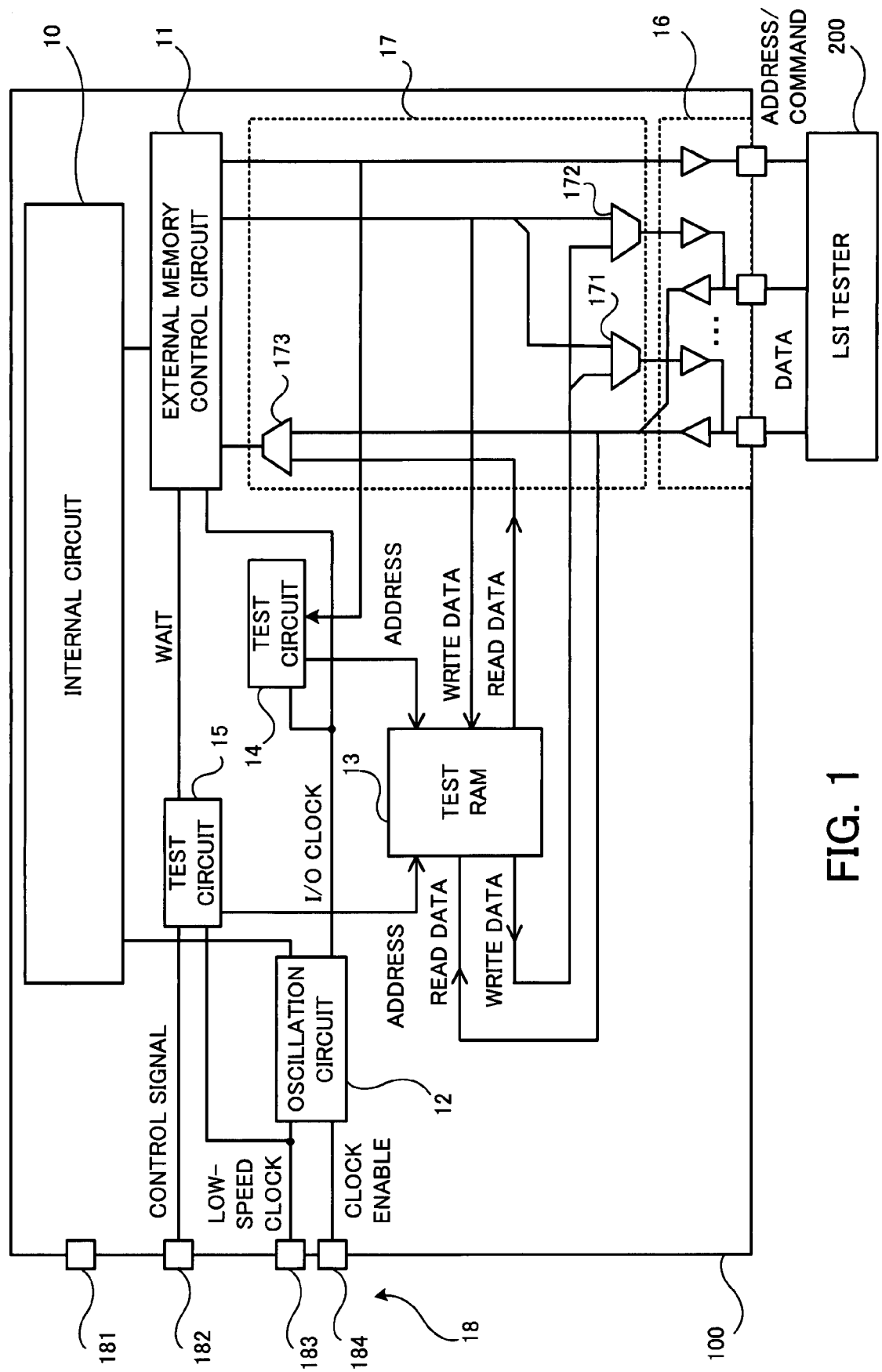
FIG. 1 is a block diagram showing a system according to a first embodiment of the present invention.

FIG. 1 is a block diagram showing a system according to a first embodiment of the present invention.

A system according to a first embodiment of the present invention comprises an integrated circuit 100 and an LSI tester 200.

The LSI tester 200 is used for testing the operation of the integrated circuit 100 and inputs various test signals to a plurality of terminals of the integrated circuit 100.

The integrated circuit 100 includes an internal circuit 10, an external memory control circuit 11, an oscillation circuit 12, a test RAM 13, test circuits 14 and 15, an I/O 16, a test selector 17, and a test signal input section 18.

The internal circuit 10 is a circuit to be measured.

The external memory control circuit 11 outputs a command to the test circuit 14 and exchanges data with the test RAM 13.

Furthermore, the external memory control circuit 11 exchanges data (read data and write data) and the like with the LSI tester 200 via the I/O 16 by using an address/command (read command or write command). The external memory control circuit 11 may be integrated with the internal circuit 10.

The oscillation circuit 12 multiplies a low-speed clock inputted from the test signal input section 18 and generates an I/O clock (high-speed clock) the frequency of which is n times (five times, for example) the frequency of the low-speed clock. The oscillation circuit 12 supplies the I/O clock to the internal circuit 10, the external memory control circuit 11, and the test circuit 14.

The operation/stop of a clock generation circuit in the oscillation circuit 12 is controlled by a clock enable signal.

In this case, a "low-speed clock" is a clock slower than one of (1) the minimum cycle of a tester clock usually used and (2) a minimum cycle in which a test can stably be performed with variations in signal delay in the integrated circuit caused by processes and variations in temperature/power supply voltage taken into consideration that is the longer. A "high-speed clock" is a clock faster than one of (1) the minimum cycle of a tester clock usually used and (2) a minimum cycle in which a test can stably be performed with variations in signal delay in the integrated circuit caused by processes and variations in temperature/power supply voltage taken into consideration that is the longer.

The test RAM 13 can be accessed simultaneously by the test circuits 14 and 15. In the test RAM 13, sections for storing the read data and sections for storing the write data are separated. The sections for storing the read data and the sections for storing the write data may be physically separated or the addresses of the sections for storing the read data and the addresses of the sections for storing the write data may be separated.

To "read" means that not the test RAM 13 but the external memory control circuit 11 reads. To "write" means that not the test RAM 13 but the external memory control circuit 11 writes. If the LSI tester 200 transfers data N times in one clock, bit width which the test RAM 13 can handle may be set to (number of terminals to which the LSI tester 200 is connected×N).

The test circuit 14 interprets a command outputted from the external memory control circuit 11 and controls timing with which the external memory control circuit 11 needs effective data and with which data outputted from the external memory control circuit 11 becomes effective. Only when data is effective, the read data is supplied from the test RAM 13 to the external memory control circuit 11. In addition, the write data is supplied from the external memory control circuit 11 to the test RAM 13.

The test circuit 14 operates by the I/O clock, so the read data and the write data are supplied at high speeds.

Data by which the external memory control circuit 11 effectively operates is data read out from an external memory or data written to the external memory. There is no special limit to noneffective data. Noneffective data is, for example, data which exists when the external memory is not read or written by the external memory control circuit 11.

The test circuit 15 designates an address of the test RAM 13 in accordance-with a control signal inputted, writes the read data to the test RAM 13 at a low speed, and reads out the write data from the test RAM 13 at a low speed.

The test circuit 15 also supplies a select signal, a write/read identification signal, and the like to the test RAM 13.

In addition, the test circuit 15 outputs WAIT (WAIT signal) to the external memory control circuit 11. The WAIT will be described later. The test circuit 15 only generates the WAIT by decoding and does not control the WAIT.

The I/O 16 includes a plurality of input-output buffers (two input-output buffers in this example) and an address/command output buffer for the external memory control circuit 11 and functions as an interface between the LSI tester 200 and the integrated circuit 100. The I/O 16 exchanges low-speed data read or written at a low speed and high-speed data read or written at a high speed with the LSI tester 200.

When the operation of the integrated circuit 100 is tested, the LSI tester 200 is connected to the I/O 16. However, after the operation of the integrated circuit 100 is tested, an external RAM, such as a synchronous DRAM (SDRAM), is connected to the I/O 16 and high-speed data is exchanged between the I/O 16 and the external RAM.

The test selector 17 includes selectors 171 and 172 for performing switching to connect the I/O 16 to the external memory control circuit 11 or the test RAM 13 and a selector 173 for performing switching to connect the external memory control circuit 11 to the test RAM 13 or the I/O 16.

A test signal is inputted from the LSI tester 200 to the test signal input section 18. The test signal input section 18 has a plurality of input terminals. To be concrete, the test signal input section 18 has an input terminal 181 for inputting a reset signal to the internal circuit 10, the external memory control circuit 11, and the test circuit 15, an input terminal 182 for inputting the control signal, an input terminal 183 for inputting the low-speed clock, and an input terminal 184 for inputting the clock enable signal.

The LSI tester 200 is connected to the integrated circuit 100 via the I/O 16. When the LSI tester 200 receives an address/command from the external memory control circuit 11, the LSI tester 200 exchanges data with the integrated circuit 100.

The control signal inputted to the test signal input section 18 is generated by a simulation performed at the time of generating a test pattern. The LSI tester 200 supplies the control signal generated by the simulation to the integrated circuit 100. When the simulation is performed at the time of generating the test pattern, the control signal is generated by a control signal generation simulation model connected to the integrated circuit 100 via the I/O 16.

When the simulation is performed, it is possible to monitor a signal in a simulation model of the integrated circuit 100 without checking a signal. The control signal generation simulation model has the function of monitoring the amount of data in a simulation model of the internal circuit 10 and a simulation model of the test RAM 13. When the test signal is generated, the control signal generation simulation model monitors the amount of data to be read by a read command issued next by a simulation model of the external memory control circuit 11, the amount of data to be written by a write command issued next by the simulation model of the external memory control circuit 11, and the amount of read data and write data stored in the simulation model of the test RAM 13 and embeds WAIT/no WAIT in the control signal which is the test signal. The simulation is performed so that it will match the internal operation of the integrated circuit 100. Therefore, even if the control signal generated by the simulation is inputted to the integrated circuit 100 on the basis of time instead of monitoring the operation of the integrated circuit 100, there arises no problem.

Figure 2:
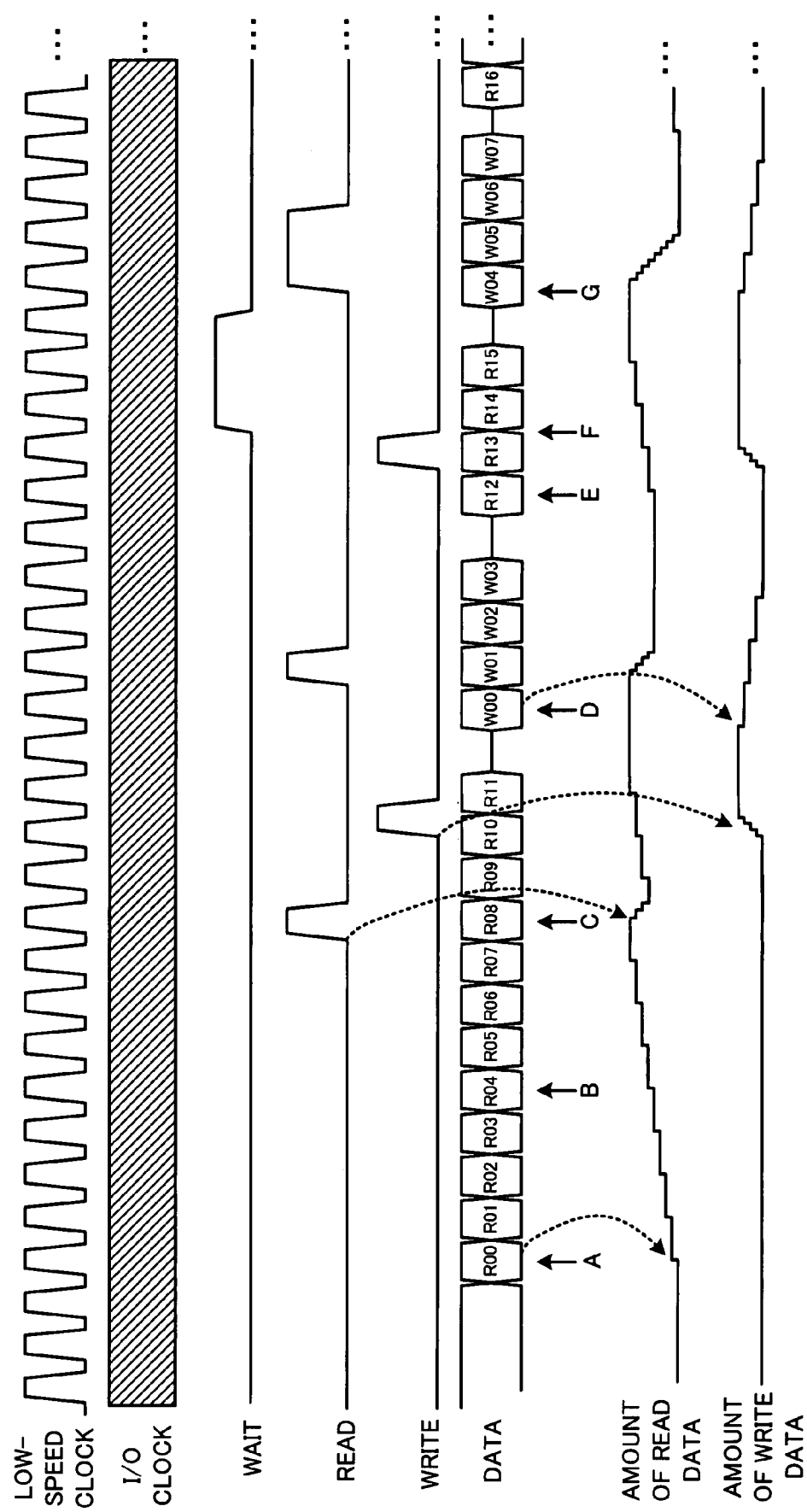
FIG. 2 shows waveforms indicative of the operation of an integrated circuit according to the first embodiment of the present invention.

FIG. 2 shows waveforms indicative of the operation of the integrated circuit according to the first embodiment of the present invention.

In FIG. 2, "read" indicates a read command issued by the external memory control circuit 11 and "write" indicates a write command issued by the external memory control circuit 11. "data" indicates read data (R00, for example) inputted from the LSI tester 200 to the test RAM 13 and write data (W00, for example) outputted from the test RAM 13 to the LSI tester 200. A burst transfer of data which is read out from or written to the test RAM 13 is performed. Burst length is a multiple of 4. "amount of read data in test RAM" indicates the amount of read data which is not read out by the test circuit 14 after the test RAM 13 is written at a low speed by the LSI tester 200, and "amount of write data in test RAM" indicates the amount of write data which is not outputted to the I/O 16 (external terminal) after the test RAM 13 is written by the test circuit 14.

When the oscillation circuit 12 operates, a clock stabilizes, and the internal circuit 10 begins to operate time A), the LSI tester 200 begins to write read data to the test RAM 13 at a low speed. That is to say, the LSI tester 200 inputs the read data to the I/O 16 and sends a control signal to the test circuit 15 and the test circuit 15 sends an address to the test RAM 13. When the LSI tester 200 writes four pieces of read data which are read out once to the test RAM 13 (time B), there is yet free capacity in the test RAM 13. Accordingly, the LSI tester 200 continues to write the read data to the test RAM 13 at a low speed. When the external memory control circuit 11 issues a read command to the test circuit 14 (time C), the test circuit 14 reads out the four pieces of read data from the test RAM 13 at a high speed and supplies the four pieces of read data to the external memory control circuit 11. After that, the external memory control circuit 11 writes write data to the test RAM 13 at a high speed. When the external memory control circuit 11 issues a write command to the test circuit 14, the test circuit 14 reads out the write data from the test RAM 13 to the LSI tester 200 at a low speed (time D). All the write data written to the test RAM 13 is read out, so read data is written to the test RAM 13 at a low speed (time E). A control signal (not shown) shows in advance that eight pieces of read data are to be read out by the next read command issued by the external memory control circuit 11. However, only four pieces of read data are stored now in the test RAM 13. Therefore, WAIT is outputted from the test circuit 15 to the external memory control circuit 11 (time F). When the read data to be read out by the next read command issued by the external memory control circuit 11 is all stored in the test RAM 13, WAIT is released and the external memory control circuit 11 issues the read command (time G).

Figure 3:
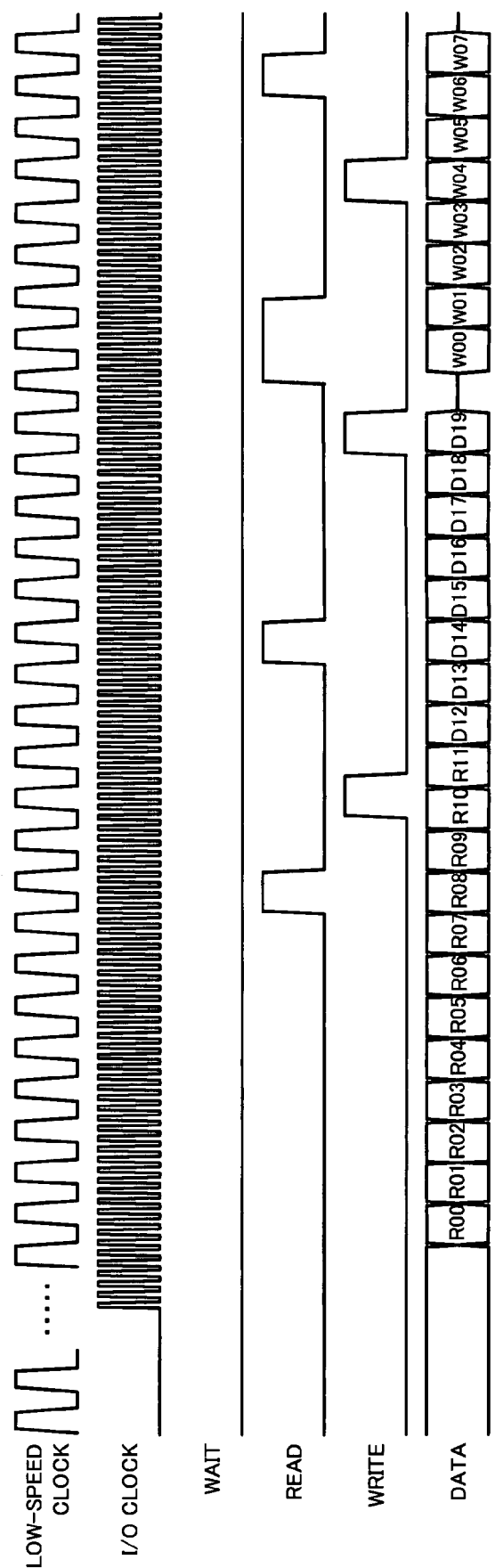
FIG. 3 shows another example of the operation of the integrated circuit according to the first embodiment of the present invention.

FIG. 3 shows another example of the operation of the integrated circuit according to the first embodiment of the present invention.

Compared with the above example, reading out write data (W00 through W07) from the test RAM 13 is delayed in FIG. 3. As a result, there is no need to use WAIT.

As has been described above, with the integrated circuit 100 according to the first embodiment of the present invention the test circuit 14 interprets a command issued by the external memory control circuit 11 and transfers only necessary data between the test RAM 13 and the external memory control circuit 11. As a result, test time can significantly be reduced. Moreover, there is no need to read useless data. Therefore, the size of the test RAM 13 can be reduced and the size of the integrated circuit 100 can be reduced.

A system according to a second embodiment of the present invention will now be described.

The differences between the systems according to the first and second embodiments of the present invention will mainly be described and descriptions of the same matters will be omitted.

Figure 4:
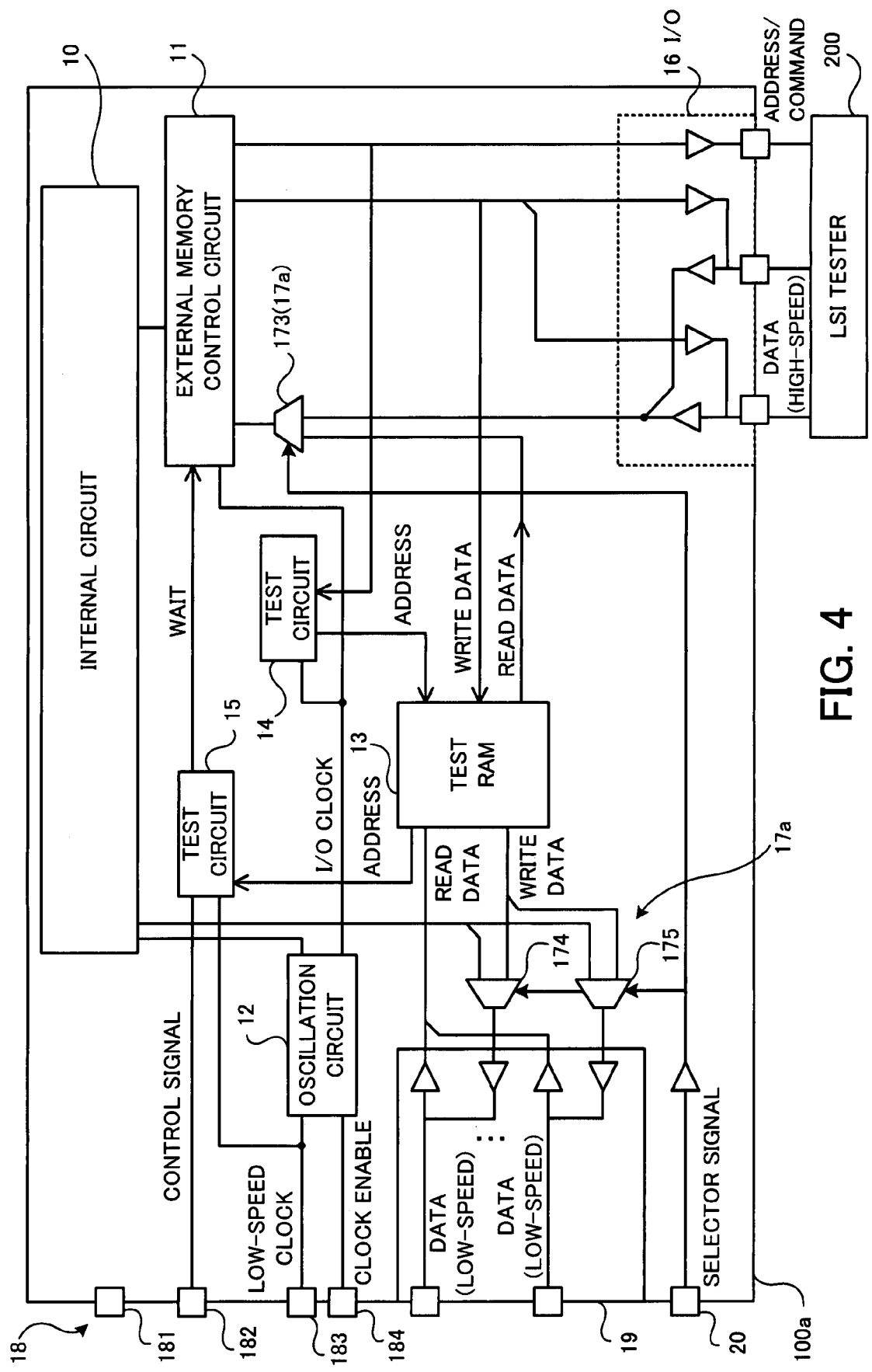
FIG. 4 is a block diagram showing a system according to a second embodiment of the present invention.

FIG. 4 is a block diagram showing the system according to the second embodiment of the present invention.

An integrated circuit 100a according to the second embodiment of the present invention differs from the integrated circuit 100 according to the first embodiment of the present invention in that low-speed data input-output terminals and high-speed data input-output terminals are separated. The integrated circuit 100a includes a test selector 17a in place of the test selector 17 and includes an I/O 19 and an input section 20.

The test selector 17a does not include selectors 171 and 172 but includes a plurality of selectors (selectors 174 and 175, in this example) for performing switching between the outputting of low-speed write data from an internal circuit 10 and the outputting of low-speed write data from a test RAM 13.

The I/O 19 includes a plurality of input-output buffers to which low-speed data is inputted bit by bit. The number of the input-output buffers which determines the bit width of the I/O 19 may be larger than the bit width of data inputted to the test RAM 13.

An I/O 16 included in the integrated circuit 100a according to the second embodiment of the present invention mainly performs high-speed data input-output.

The input section 20 includes input terminals for inputting selector signals for switching a selector 173 and the selectors 174 and 175.

The same effect that is obtained by the system according to the first embodiment of the present invention can be achieved by the system according to the second embodiment of the present invention.

With the system according to the second embodiment of the present invention there is no need to use the selectors 171 and 172. Therefore, timing adjustment can easily be performed in the I/O 16.

A system according to a third embodiment of the present invention will now be described.

The differences between the systems according to the second and third embodiments of the present invention will mainly be described and descriptions of the same matters will be omitted.

Figure 5:
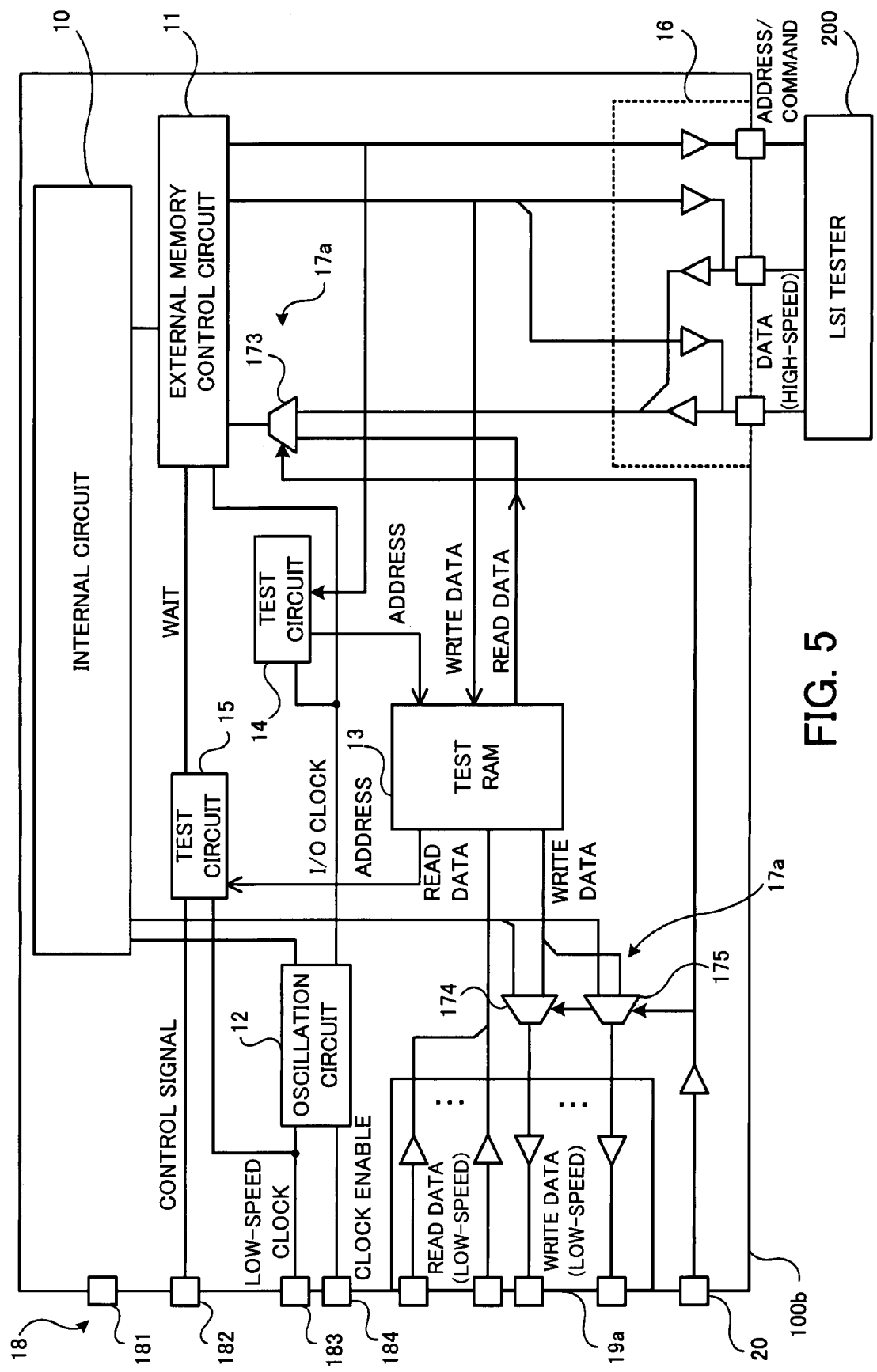
FIG. 5 is block diagram showing a system according to a third embodiment of the present invention.

FIG. 5 is block diagram showing the system according to the third embodiment of the present invention.

An integrated circuit 100b according to the third embodiment of the present invention differs from the integrated circuit 100a according to the second embodiment of the present invention in that it includes an I/O 19a in which terminals for inputting read data and terminals for outputting write data are separated.

The same effect that is obtained by the system according to the second embodiment of the present invention can be achieved by the system according to the third embodiment of the present invention. In addition, with the system according to the third embodiment of the present invention the input terminals and the output terminals are separated. As a result, band width for low-speed data input-output can be increased and test time can be reduced. Furthermore, when data at a terminal to which a signal is not frequently inputted at test time is not effective, the terminal can also be used for inputting read data to a test RAM 13. When data at a terminal from which a signal is not frequently outputted at the test time is not effective, the terminal can also be used for outputting write data from the test RAM 13. By doing so, a test pattern can be made smaller.

A system according to a fourth embodiment of the present invention will now be described.

The differences between the systems according to the third and fourth embodiments of the present invention will mainly be described and descriptions of the same matters will be omitted.

Figure 6:
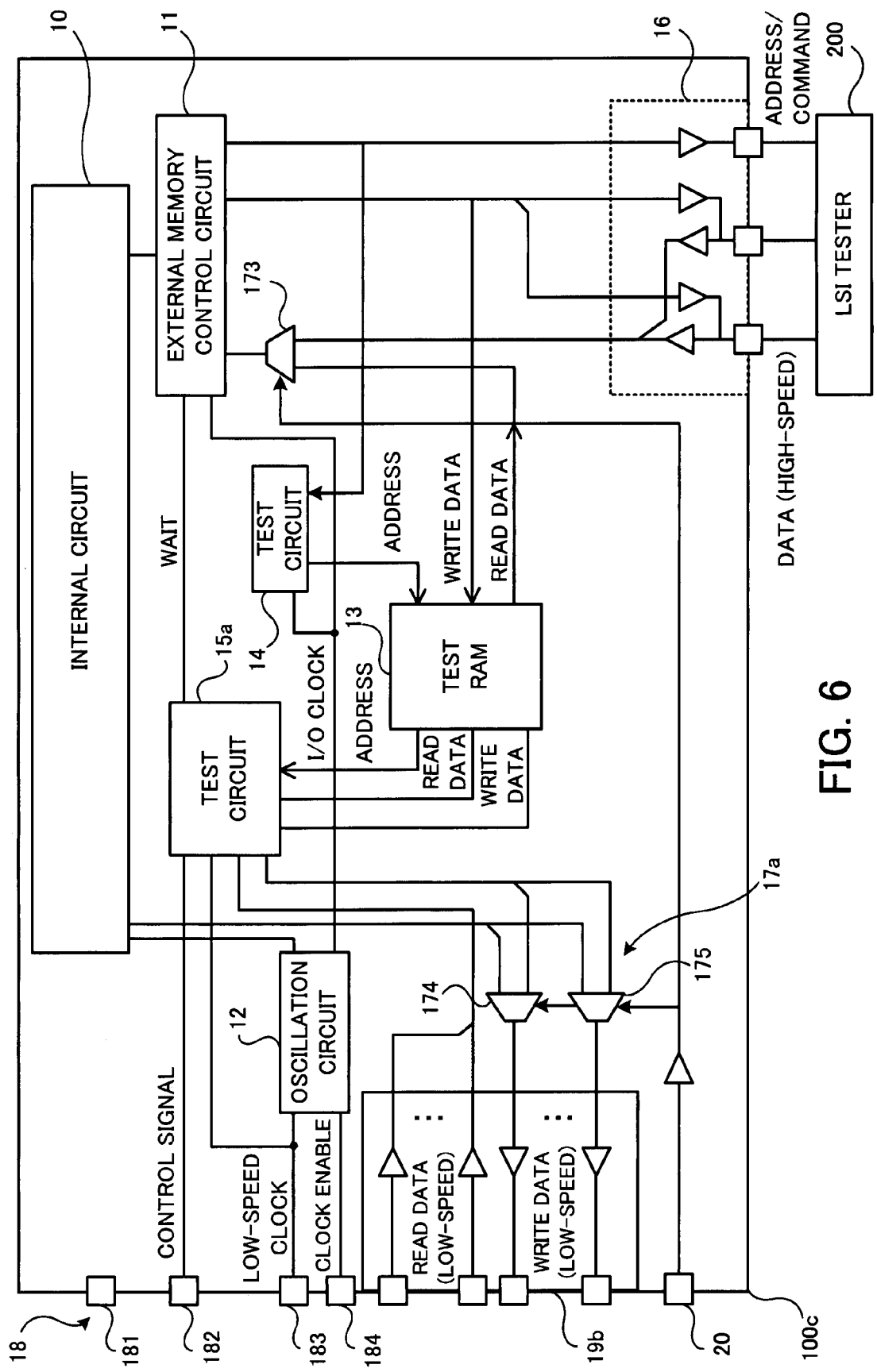
FIG. 6 is a block diagram showing an integrated circuit according to a fourth embodiment of the present invention.

FIG. 6 is a block diagram showing an integrated circuit according to the fourth embodiment of the present invention.

An integrated circuit 100c according to the fourth embodiment of the present invention differs from the integrated circuit 100b according to the third embodiment of the present invention in that the bit width of input terminals and output terminals included in an I/O 19b is smaller than bit width which an LSI tester 200 can handle, that read data is all inputted from the I/O 19b to a test circuit 15a at a low speed, and that the test circuit 15a converts the bit width.

In the following descriptions it is assumed that the I/O 19b includes sixteen input terminals and that the width of data inputted to a test RAM 13 is 64 bits.

The test circuit 15a includes a low-speed data input circuit for dividing read data into pieces of data and inputting each piece of data to the test RAM 13 at a low speed, a buffer for holding data outputted from the low-speed data input circuit, and a low-speed data output circuit for dividing write data into pieces of data and outputting each piece of data to the I/O 19b at a low speed.

Figure 7:
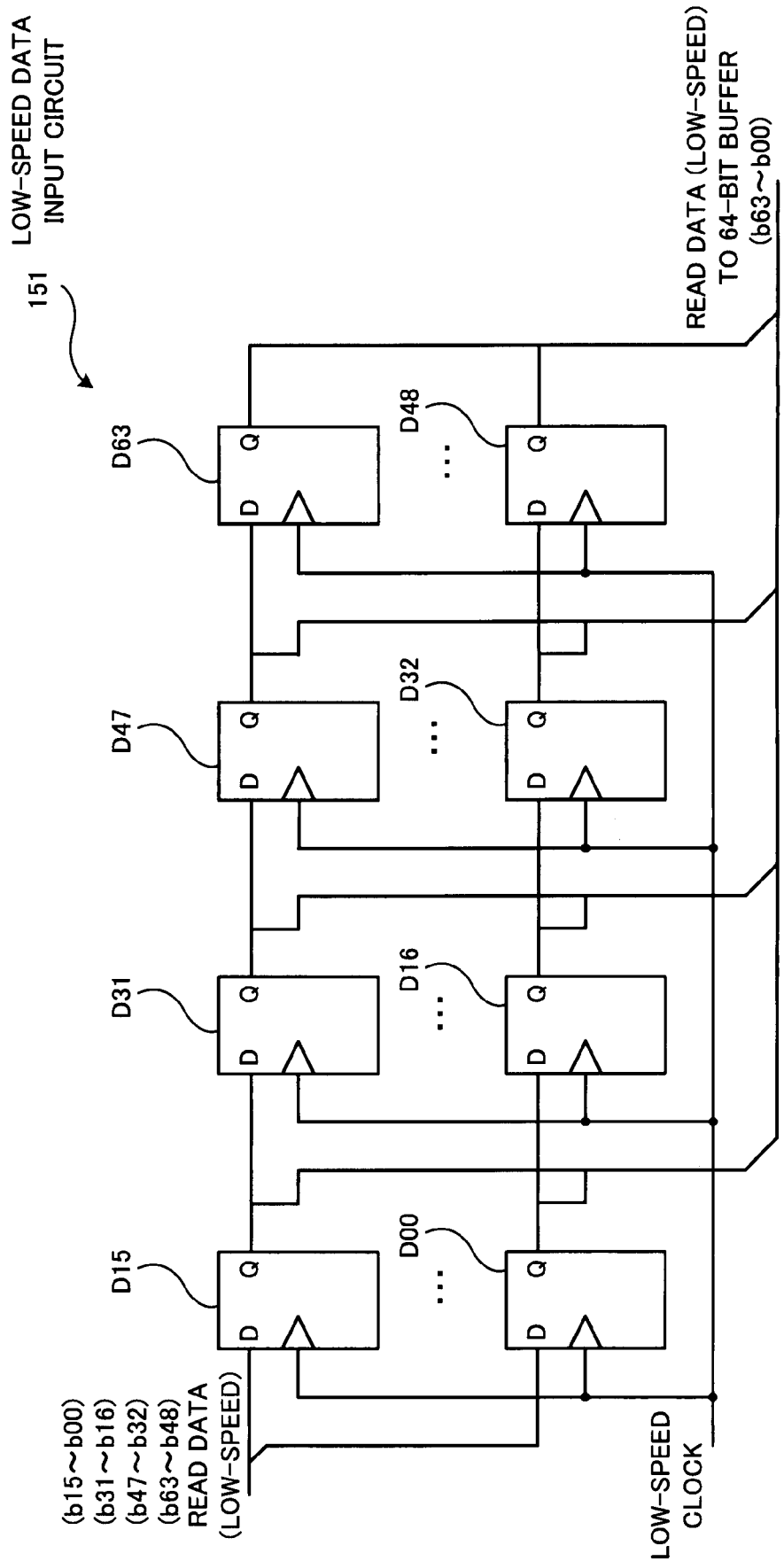
FIG. 7 shows a low-speed data input circuit.

FIG. 7 shows the low-speed data input circuit.

A low-speed data input circuit 151 includes sixty-four D flip-flops D00 through D63.

When 16-bit read data b15 through b00, b31 through b16, b47 through b32, and b63 through 48 are inputted in this order from each input terminal of the I/O 19b, each 16-bit read data is stored in the D flip-flops D00 through D15, the D flip-flops D16 through D31, the D flip-flops D32 through D47, and the D flip-flops D48 through D63 each time a low-speed clock is inputted. As a result, 64-bit low-speed read data b63 through b00 is outputted. The low-speed read data b63 through b00 is held in a 64-bit buffer (not shown).

Figure 8:
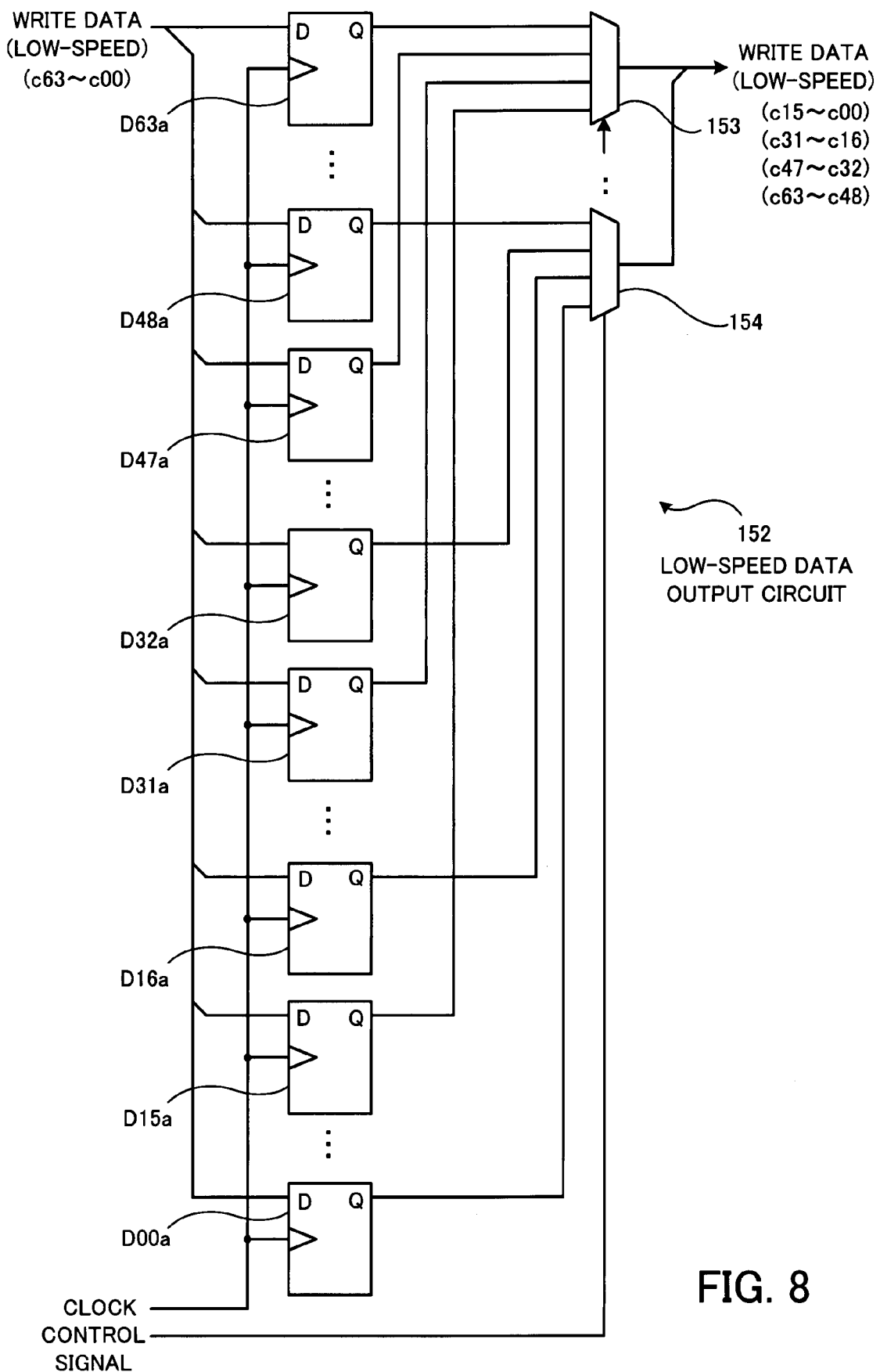
FIG. 8 shows a low-speed data output circuit.

FIG. 8 shows the low-speed data output circuit.

A low-speed data output circuit 152 includes sixty-four D flip-flops D00a through D63a and sixteen selectors (two selectors 153 and 154 are shown in FIG. 8) to each of which output terminals of four D flip-flops are connected. Output terminals of D flip-flops which output signals corresponding to the same bit number of four pieces of data obtained by dividing 64-bit data into quarters are connected to each selector. For example, output terminals of the D flip-flops D63a, D47a, D31a, and D15a which output signals corresponding to the sixteenth bits are connected to the selector 153.

A low-speed clock inputted from an input terminal 183 or an I/O clock outputted from an oscillation circuit 12 may be used as a clock. The selectors 153 and 154 are operated by a control signal inputted from an input terminal 182.

64-bit low-speed write data c63 through c00 outputted from the test RAM 13 is stored in the D flip-flops D63a through D48a, the D flip-flops D47a through D32a, the D flip-flops D31a through D16a, and the D flip-flops D15a through D00a. 16-bit low-speed write data c63 through c48, 16-bit low-speed write data c47 through c32, 16-bit low-speed write data c31 through c16, and 16-bit low-speed write data c15 through c00 selected by the sixteen selectors are outputted to the LSI tester 200 via output buffers included in the I/O 19b.

Figure 9:
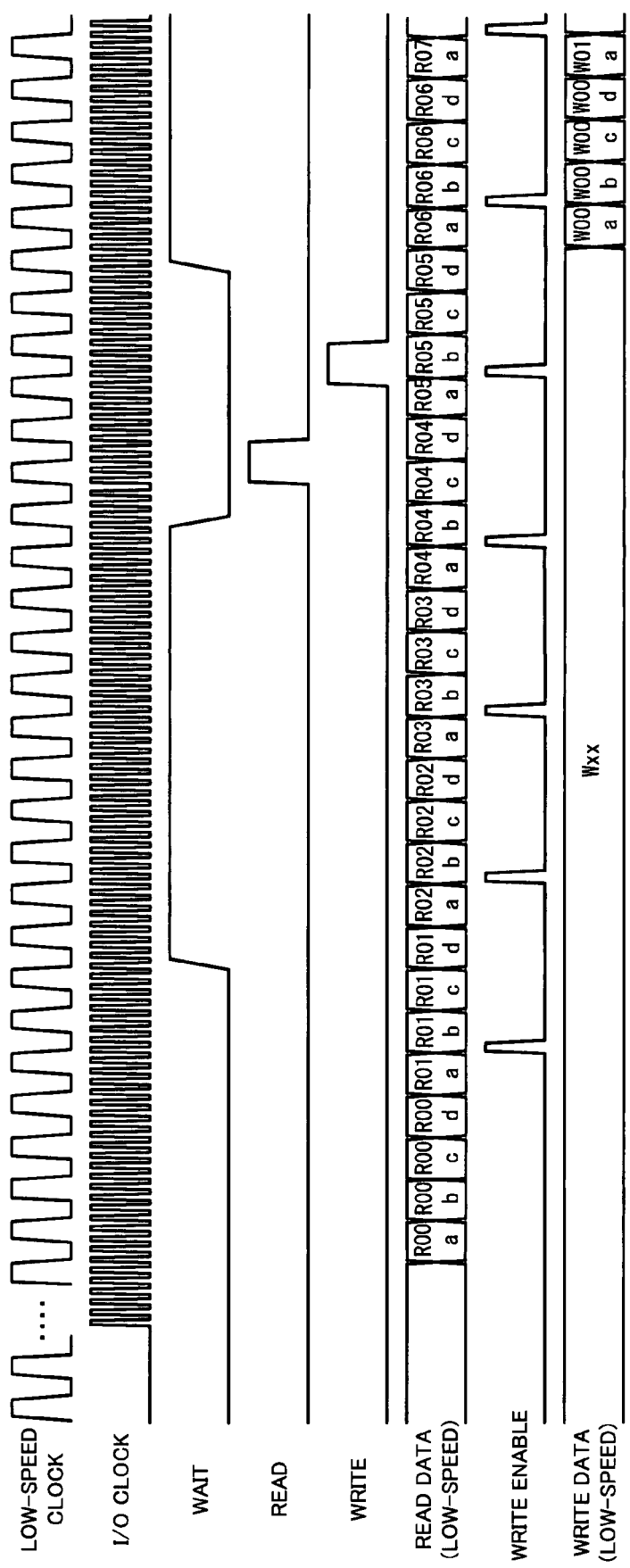
FIG. 9 shows waveforms indicative of the operation of the integrated circuit according to the fourth embodiment of the present invention.
Figure 10:
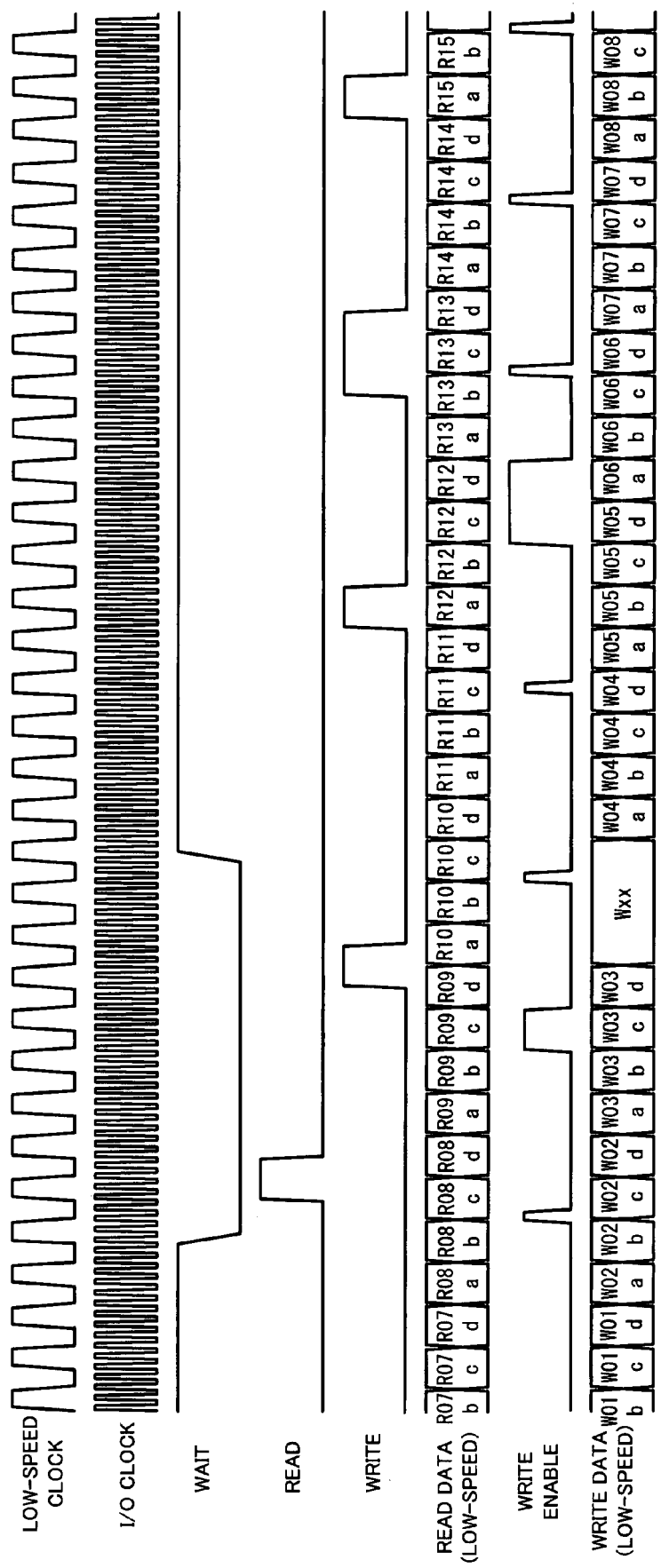
FIG. 10 shows waveforms indicative of the operation of the integrated circuit according to the fourth embodiment of the present invention.

FIGS. 9 and 10 show waveforms indicative of the operation of the integrated circuit according to the fourth embodiment of the present invention.

In FIGS. 9 and 10, read data RN is divided into RNa, RNb, RNc, and RNd and is inputted. Write data WN is divided into WNa, WNb, WNc, and WNd and is outputted. The write data "Wxx" indicates that corresponding write data does not exist. Write enable is a kind of a control signal and indicates timing with which the test circuit 15a writes read data to the test RAM 13. Read data is divided into four pieces of data (for example, R00=R00a, R00b, R00c, R00d) each of which is made up of sixteen bits and is inputted or outputted. Similarly, write data is divided into four pieces of data each of which is made up of sixteen bits and is inputted or outputted.

The same effect that is obtained by the system according to the third embodiment of the present invention can be achieved by the system according to the fourth embodiment of the present invention.

With the system according to the fourth embodiment of the present invention the I/O 19b includes only the sixteen input terminals. However, 64-bit data can be supplied to the test RAM 13. That is to say, the system according to the fourth embodiment of the present invention is effective especially in cases where the number of input terminals and output terminals which can be secured is smaller than the number of bits included in data inputted at test time.

A system according to a fifth embodiment of the present invention will now be described.

The differences between the systems according to the fourth and fifth embodiments of the present invention will mainly be described and descriptions of the same matters will be omitted.

An integrated circuit 100d according to the fifth embodiment of the present invention differs from the integrated circuit 100c according to the fourth embodiment of the present invention in that when a low-speed data output circuit outputs low-speed write data to an external terminal, the low-speed data output circuit compares low-speed write data with 16-bit write data adjacent thereto and outputs a comparison result.

Figure 11:
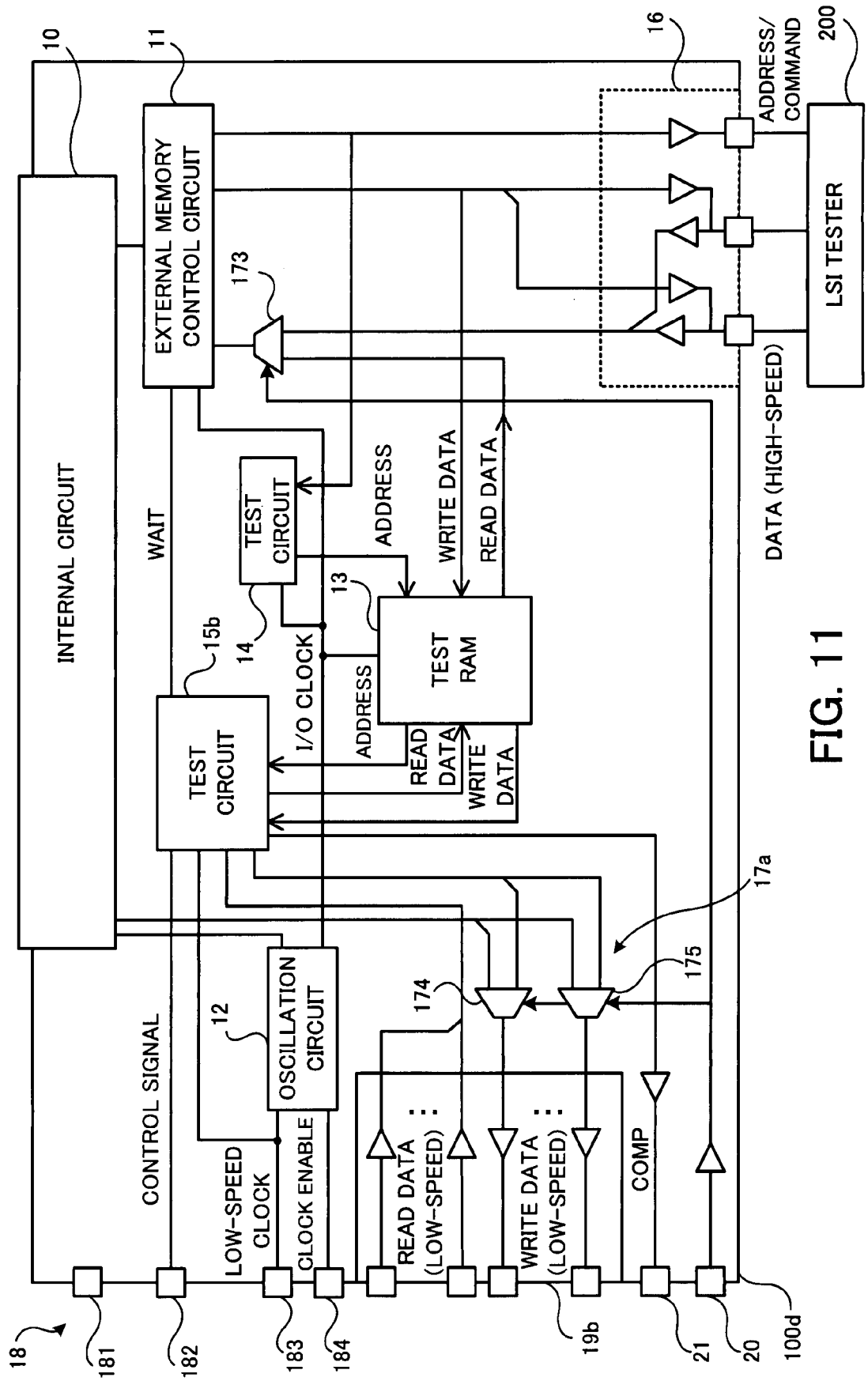
FIG. 11 is block diagram showing a system according to a fifth embodiment of the present invention.

FIG. 11 is block diagram showing the system according to the fifth embodiment of the present invention.

The integrated circuit 100d includes a test circuit 15b including the low-speed data output circuit for outputting a COMP signal (described later) and an output section 21 which functions as an interface for outputting the COMP signal to an LSI tester 200.

Figure 12:
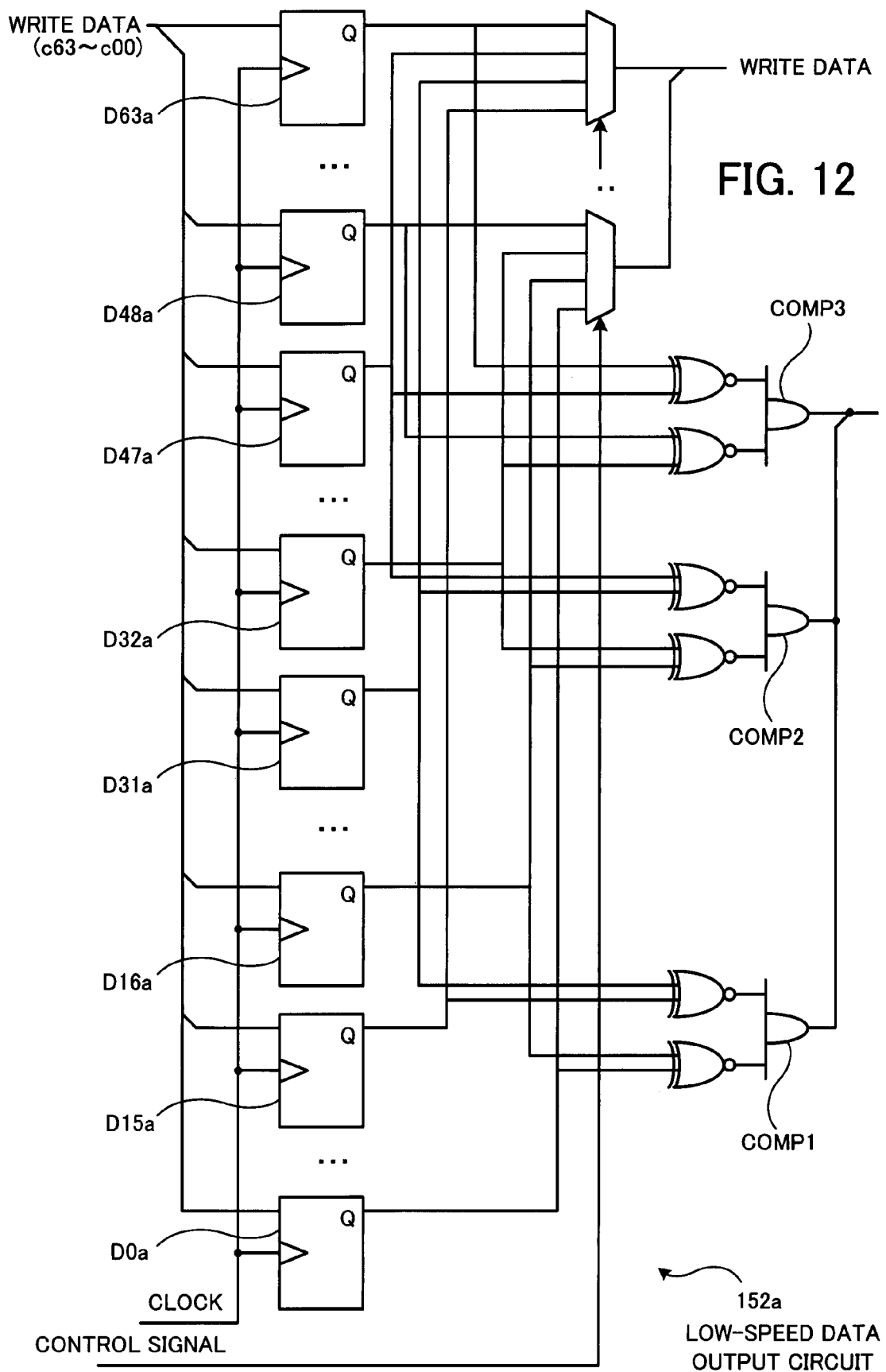
FIG. 12 is a circuit diagram showing a low-speed data output circuit included in an integrated circuit according to the fifth embodiment of the present invention.

FIG. 12 is a circuit diagram showing the low-speed data output circuit included in the integrated circuit according to the fifth embodiment of the present invention.

In a low-speed data output circuit 152a, 64-bit low-speed write data c63 through c48, c47 through c32, c31 through c16, and c15 through c00 outputted from a test RAM 13 is stored in D flip-flops D63a through D48a, D flip-flops D47a through D32a, D flip-flops D31a through D16a, and D flip-flops D15a through D00a respectively. A comparator COMP3 compares the write data c63 through c48 with the write data c47 through c32, a comparator COMP2 compares the write data c47 through c32 with the write data c31 through c16, and a comparator COMP1 compares the write data c31 through c16 with the write data c15 through c00. The COMP signal indicative of comparison results is outputted to the LSI tester 200 via an I/O 19b. Hereinafter the COMP signal outputted will be represented as "000" including outputs from the comparators COMP3, COMP2, and COMP1 in this order.

The (16 bits×4) low-speed write data outputted at a time from the test RAM 13 and the comparison results are referred to. If the write data c63 through c48, the write data c47 through c32, the write data c31 through c16, and the write data c15 through c00 are the same from the comparison results, each comparator outputs "1". Accordingly, the test circuit 15b outputs one piece of low-speed write data (16 bits) and the COMP signal "111". As a result, outputting the write data once (one clock) enables the LSI tester 200 to decide the 64-bit data. If three of the write data c63 through c48, the write data c47 through c32, the write data c31 through c16, and the write data c15 through c00 are the same, the test circuit 15b outputs two pieces of write data (16 bits×2) and one of the COMP signals "110," "101," and "011". For example, if the write data c63 through c48, the write data c47 through c32, and the write data c31 through c16 are the same, the test circuit 15b outputs the COMP signal "110". As a result, outputting the write data twice (two clocks) enables the LSI tester 200 to decide the 64-bit data. If two of the write data c63 through c48, the write data c47 through c32, the write data c31 through c16, and the write data c15 through c00 are the same, the test circuit 15b outputs three pieces of write data (16 bits×3) and one of the COMP signals "100," "010," and "001". For example, if the write data c63 through c48 and the write data c47 through c32 are the same, the test circuit 15b outputs the COMP signal "100". As a result, outputting the write data three times (three clocks) enables the LSI tester 200 to decide the 64-bit data.

In FIG. 12, 16-bit write data and 16-bit write data adjacent thereto are compared. However, there is no special limit to combination for comparison. For example, the write data c63 through c48 and the write data c31 through c16 may be compared, the write data c63 through c48 and the write data c15 through c00 may be compared, or the write data c47 through c32 and the write data c15 through c00 may be compared.

The same effect that is obtained by the system according to the fourth embodiment of the present invention can be achieved by the system according to the fifth embodiment of the present invention. The four pieces of 16-bit write data obtained by dividing the (16 bits×4) write data read out from the test RAM 13 may be the same. In this case, 16-bit write data is outputted to en external terminal four times in the system according to the fourth embodiment of the present invention. With the system according to the fifth embodiment of the present invention, however, 16-bit write data is outputted only once, so the number of input clocks can be reduced. As a result, test time can be reduced.

A system according to a sixth embodiment of the present invention will now be described.

The differences between the systems according to the fifth and sixth embodiments of the present invention will mainly be described and descriptions of the same matters will be omitted.

The structure of an integrated circuit according to the sixth embodiment of the present invention is the same as that of the integrated circuit 100d according to the fifth embodiment of the present invention. The integrated circuit according to the sixth embodiment of the present invention differs from the integrated circuit 100d according to the fifth embodiment of the present invention in test signal pattern. To be concrete, when a test circuit 15b writes read data to a test RAM 13, an I/O clock is used. Similarly, when write data is read out to an LSI tester 200, the I/O clock is used. When a piece of data is written is succession, the piece of data and the number of the pieces of data are designated.

In this case, the piece of data and the number of the pieces of data are designated by a control signal. For example, it is assumed that when the test circuit 15b receives read data R01a through R01d, the test circuit 15b receives a control signal which indicates that read data R01 through R03 are the same. Then the test circuit 15b generates two pieces of read data each of which is the same as the read data R01a through R01d. When the test circuit 15b receives write enable, the test circuit 15b writes the three pieces of read data R01a through R01d which are the same to the test RAM 13. The width of the write enable is proportional to the number of the written pieces of data which are the same.

Figure 13:
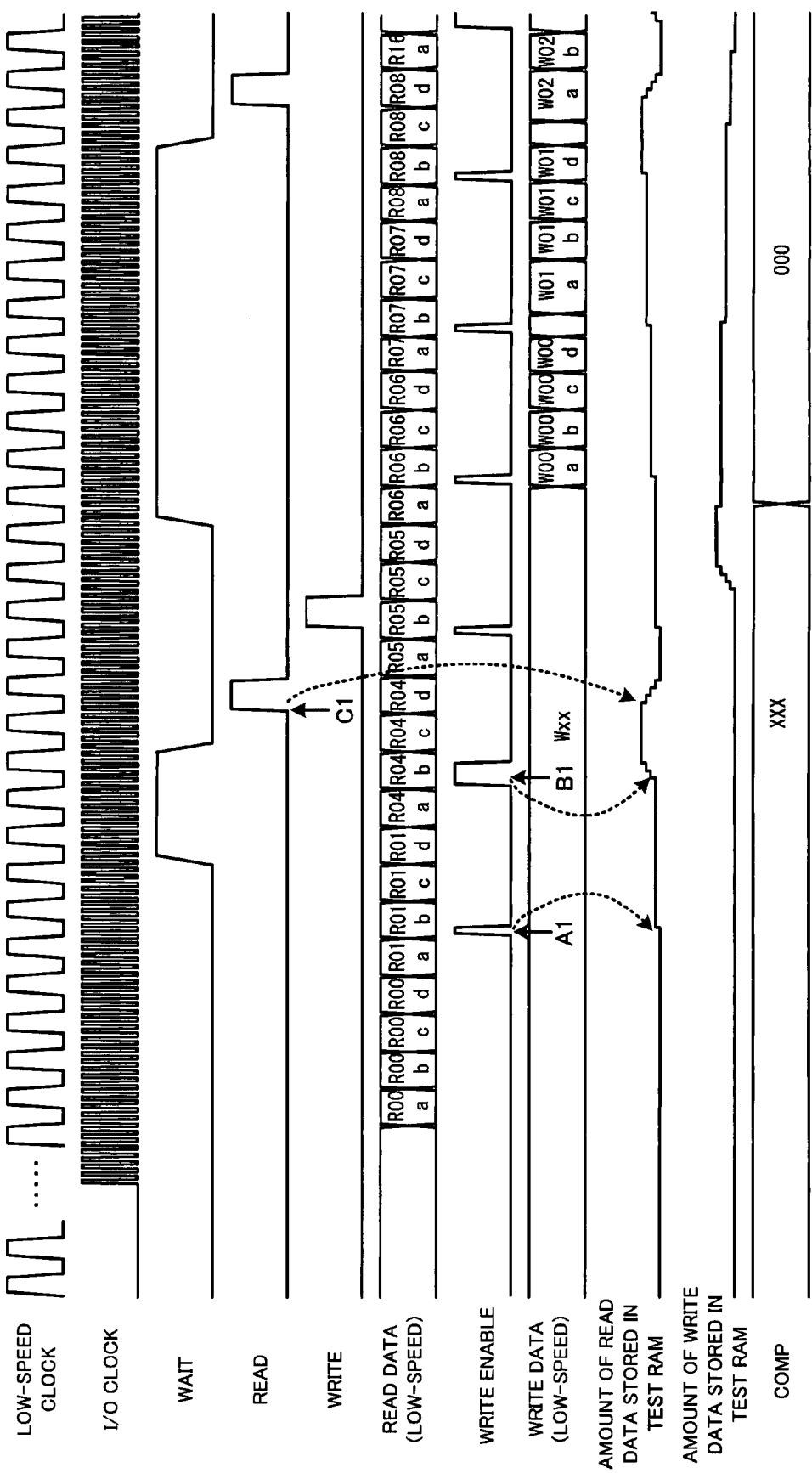
FIG. 13 shows waveforms indicative of the operation of an integrated circuit according to a sixth embodiment of the present invention.
Figure 14:
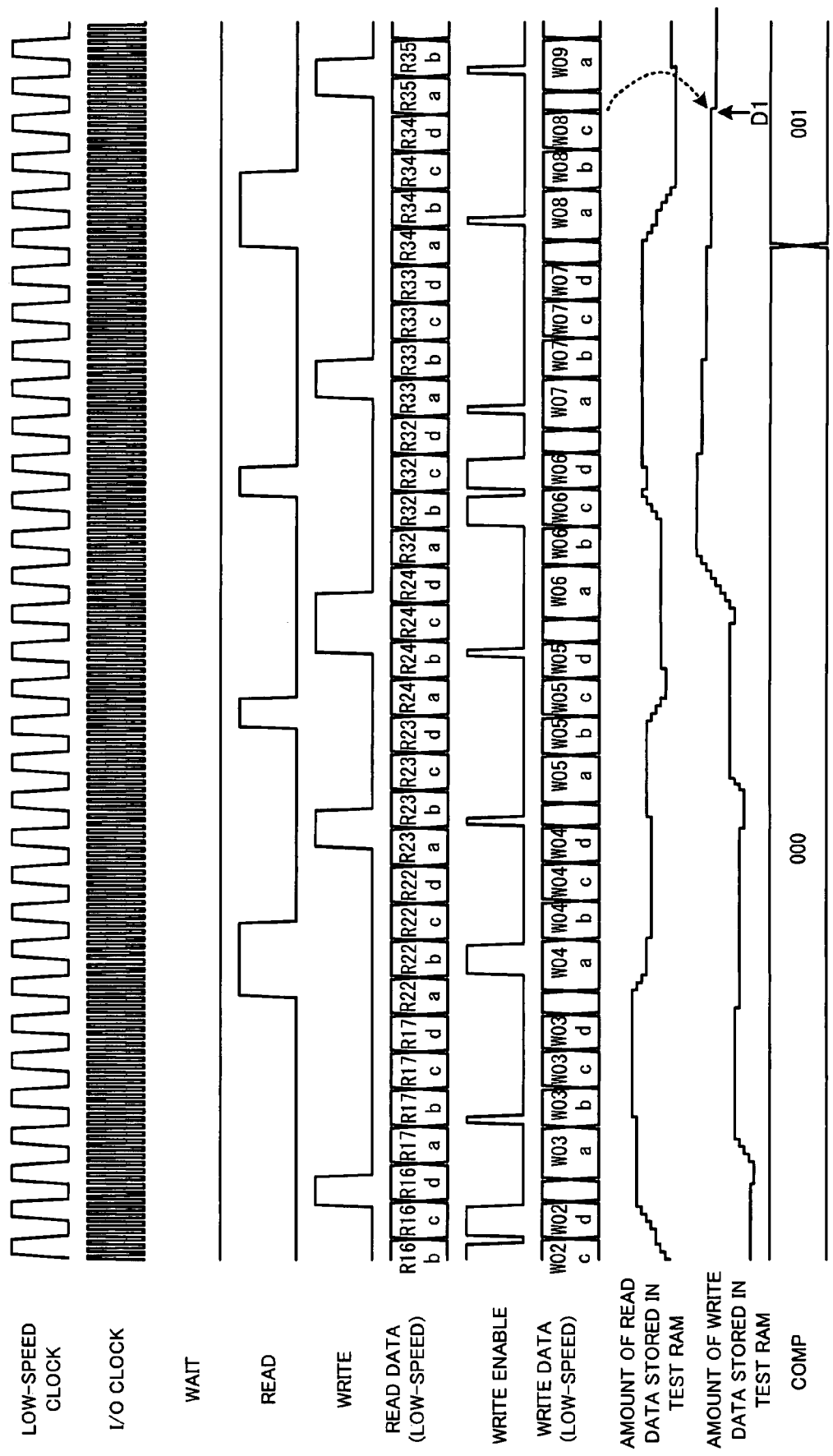
FIG. 14 shows waveforms indicative of the operation of the integrated circuit according to the sixth embodiment of the present invention.

FIGS. 13 and 14 show waveforms indicative of the operation of the integrated circuit according to the sixth embodiment of the present invention.

In FIGS. 13 and 14, read data R01 through R03 are the same, read data R08 through R15 are the same, read data R17 through R21 are the same, and read data R24 through R31 are the same. In addition, write data c63 through c48 included in write data W08 and W09 are the same and write data c47 through c32 included in the write data W08 and W09 are the same. Write data c63 through c48 included in write data W10 through W15 are the same, write data c47 through c32 included in the write data W10 through W15 are the same, write data c31 through c16 included in the write data W10 through W15 are the same, and write data c15 through c00 included in the write data W10 through W15 are the same. The width of write enable is proportional to the number of written pieces of data which are the same. "COMP" indicates a COMP signal outputted to an output section 21. As stated above, the COMP signal "001" indicates that write data WNc and WNd are the same and the COMP signal "111" indicates that write data WNa, WNb, WNc, and WNd are the same.

Descriptions of the same matters that are described regarding the waveforms indicative of the operation of the integrated circuit 100 according to the first embodiment of the present invention will be omitted.

In the integrated circuit according to the sixth embodiment of the present invention, the test circuit 15b first reads read data at a low speed.

When the test circuit 15b receives write enable (time A1), the test circuit 15b writes the read data to the test RAM 13 at a low speed. As a result, the amount of read data stored in the test RAM 13 increases by one.

When the test circuit 15b then receives write enable (time B1), the test circuit 15b writes the read data R01 through R03 which are the same to the test RAM 13 at a low speed. As a result, the amount of read data stored in the test RAM 13 increases by three.

When an external memory control circuit 11 outputs a read command to a test circuit 14 (time C1), the test circuit 14 reads out the read data from the test RAM 13 to the external memory control circuit 11 at a high speed.

When the external memory control circuit 11 outputs the read command to the test circuit 14 (time C1), the test circuit 14 writes write data from the external memory control circuit 11 to the test RAM 13 at a high speed.

The operation is performed in this way. Instructions to output write data from the test circuit 15b are given by a control signal. Write data W08a, W08b, and W08c are written to the test RAM 13. When a comparator outputs the COMP signal "001," the COMP signal "001" is outputted to the output section 21 and the write data W08a, W08b, and W08c are outputted to an I/O 19b (time D1). When write data W10a (WNa) is written to the test RAM 13 (not shown), the test RAM 13 outputs the COMP signal "111" to the output section 21 and outputs the write data W10a to the I/O 19b.

The same effect that is obtained by the system according to the fifth embodiment of the present invention can be achieved by the system according to the sixth embodiment of the present invention.

With the system according to the sixth embodiment of the present invention, writing from the test circuit 15b to the test RAM 13 is performed at a high speed and the amount of data outputted at a low speed after the reading by the test circuit 14 is reduced. Therefore, test time can be reduced compared with the system according to the fifth embodiment of the present invention. By using data in which the same piece of data appears in succession in read data or write data especially in the case of, for example, an image, time taken to test the encoding or decoding of a dynamic image can be reduced significantly.

A system according to a seventh embodiment of the present invention will now be described.

The differences between the systems according to the fifth and seventh embodiments of the present invention will mainly be described and descriptions of the same matters will be omitted.

Figure 15:
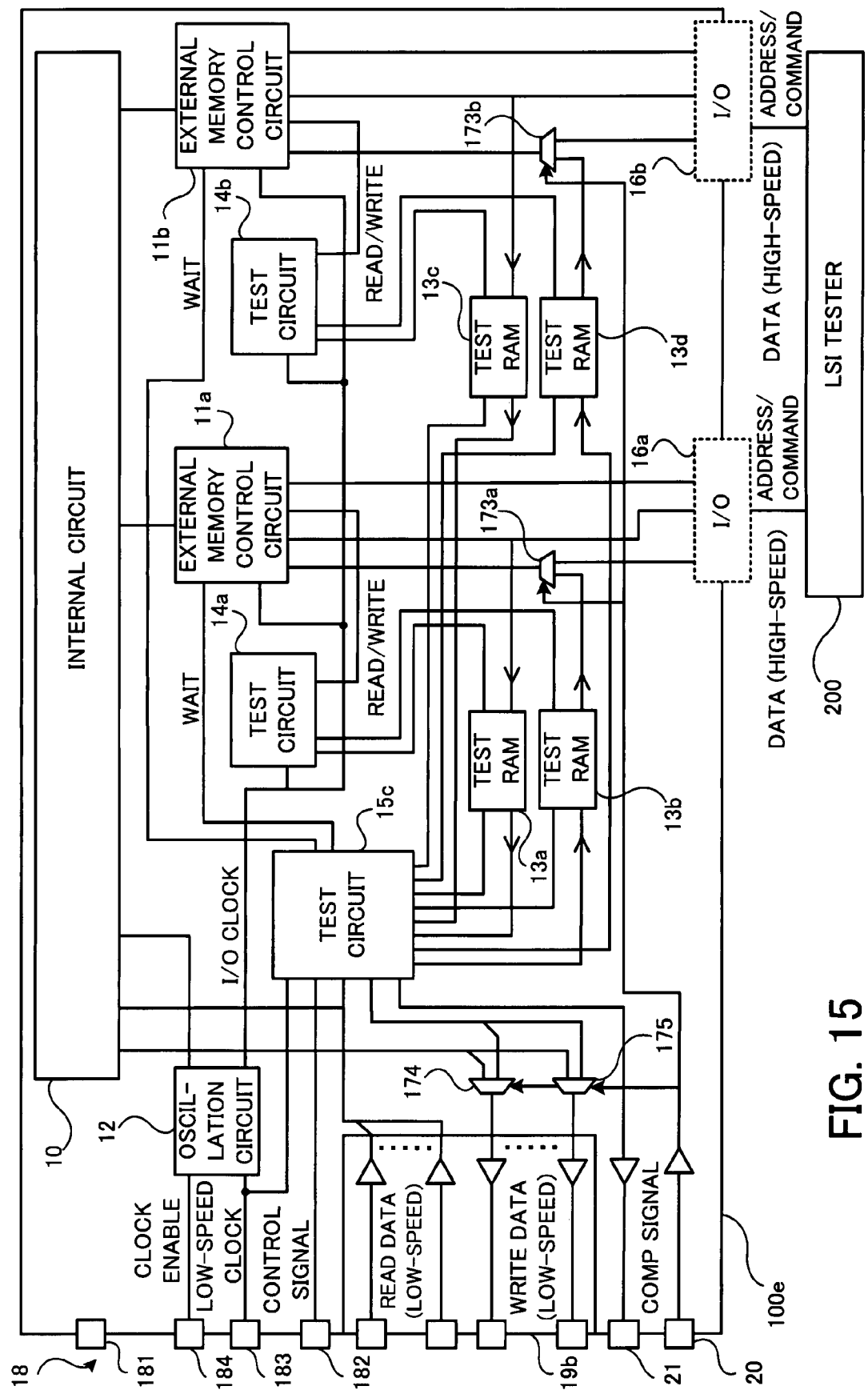
FIG. 15 is block diagram showing a system according to a seventh embodiment of the present invention.

FIG. 15 is block diagram showing the system according to the seventh embodiment of the present invention. An arrow in FIG. 15 indicates the direction of a signal.

An integrated circuit 100e according to the seventh embodiment of the present invention includes two external memory control circuits 11a and 11b, a test RAM 13a for accepting write data sent from the external memory control circuit 11a, a test RAM 13b for accepting read data sent to the external memory control circuit 11a, a test RAM 13c for accepting write data sent from the external memory control circuit 11b, a test RAM 13d for accepting read data sent to the external memory control circuit 11b, test circuits 14a and 14b which function the same as the test circuit 14, and a test circuit 15c which functions the same as the test circuit 15b and which exchanges data with each test RAM.

An LSI tester 200 inputs read data and write data to the external memory control circuits 11a and 11b. The read data and the write data are common to the external memory control circuits 11a and 11b. Each of the test circuits 14a and 14b receives the type of read/write and timing in place of a memory command.

A low-speed data input circuit and a low-speed data output circuit included in the test circuit 15c of the integrated circuit 100e according to the seventh embodiment of the present invention will be described.

Figure 16:
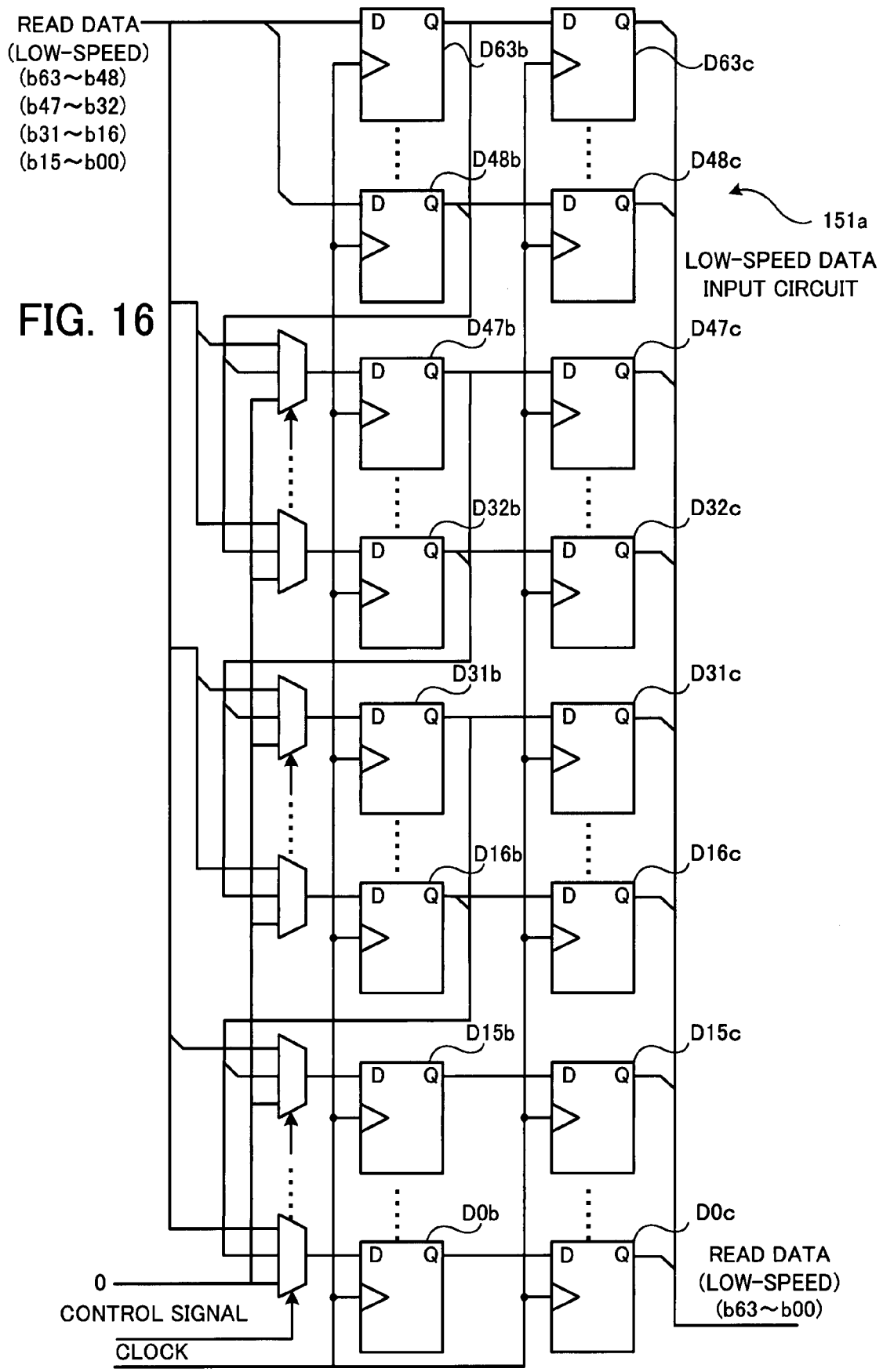
FIG. 16 shows a low-speed data input circuit included in an integrated circuit according to the seventh embodiment of the present invention.

FIG. 16 shows a low-speed data input circuit included in the integrated circuit according to the seventh embodiment of the present invention.

In this example, the width of data handled by the external memory control circuits 11a and 11b is 64 bits and a low-speed data input circuit 151a has sixteen terminals used for low-speed data input.

The LSI tester 200 inputs read data to the low-speed data input circuit 151a in the order of b63 through b48, b47 through b32, b31 through b16, and b15 through b00. There are many cases where the same piece of data appears in succession in, for example, image data. Accordingly, selectors are located at stages before D flip-flops D0b through D15b, D flip-flops D16b through D31b, and D flip-flops D32b through D47b so that the read data b63 through b48, b47 through b32, b31 through b16, and b15 through b00 which are separated every sixteen bits and which are the same can be inputted by one clock. However, the read data b63 through b48 can be inputted from the terminals, so selectors are not located at a stage before D flip-flops D48b through D63b. "0" is inputted to each selector with a case where data stored in memories cleared to zero is read taken into consideration.

Figure 17:
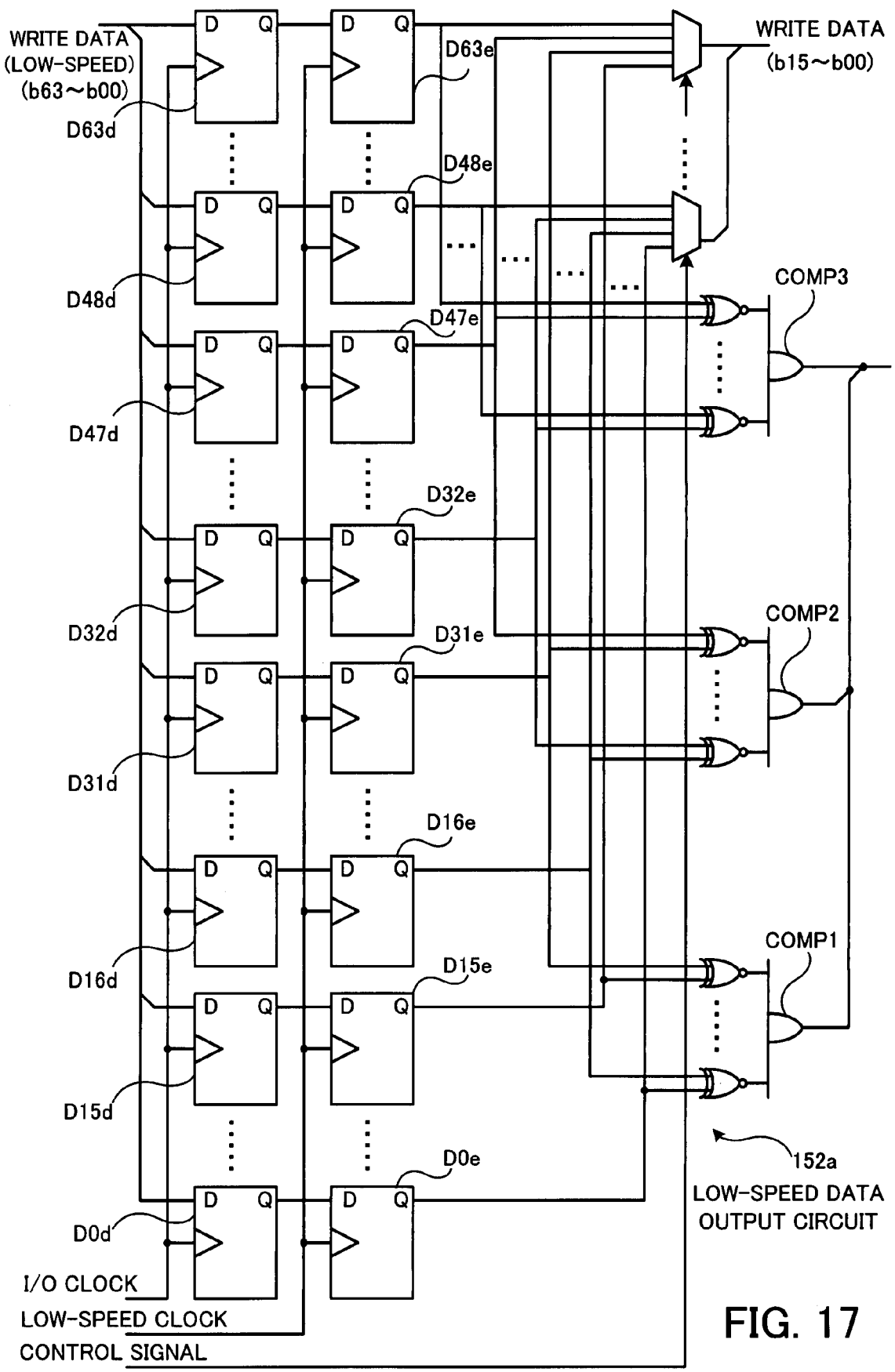
FIG. 17 shows a low-speed data output circuit included in the integrated circuit according to the seventh embodiment of the present invention.

FIG. 17 shows a low-speed data output circuit included in the integrated circuit according to the seventh embodiment of the present invention.

A low-speed data output circuit 152a includes buffers located at two stages (in two columns), so input of write data from the test RAMs 13a and 13c and output of write data to an I/O 19 can be performed at the same time.

Figure 18:
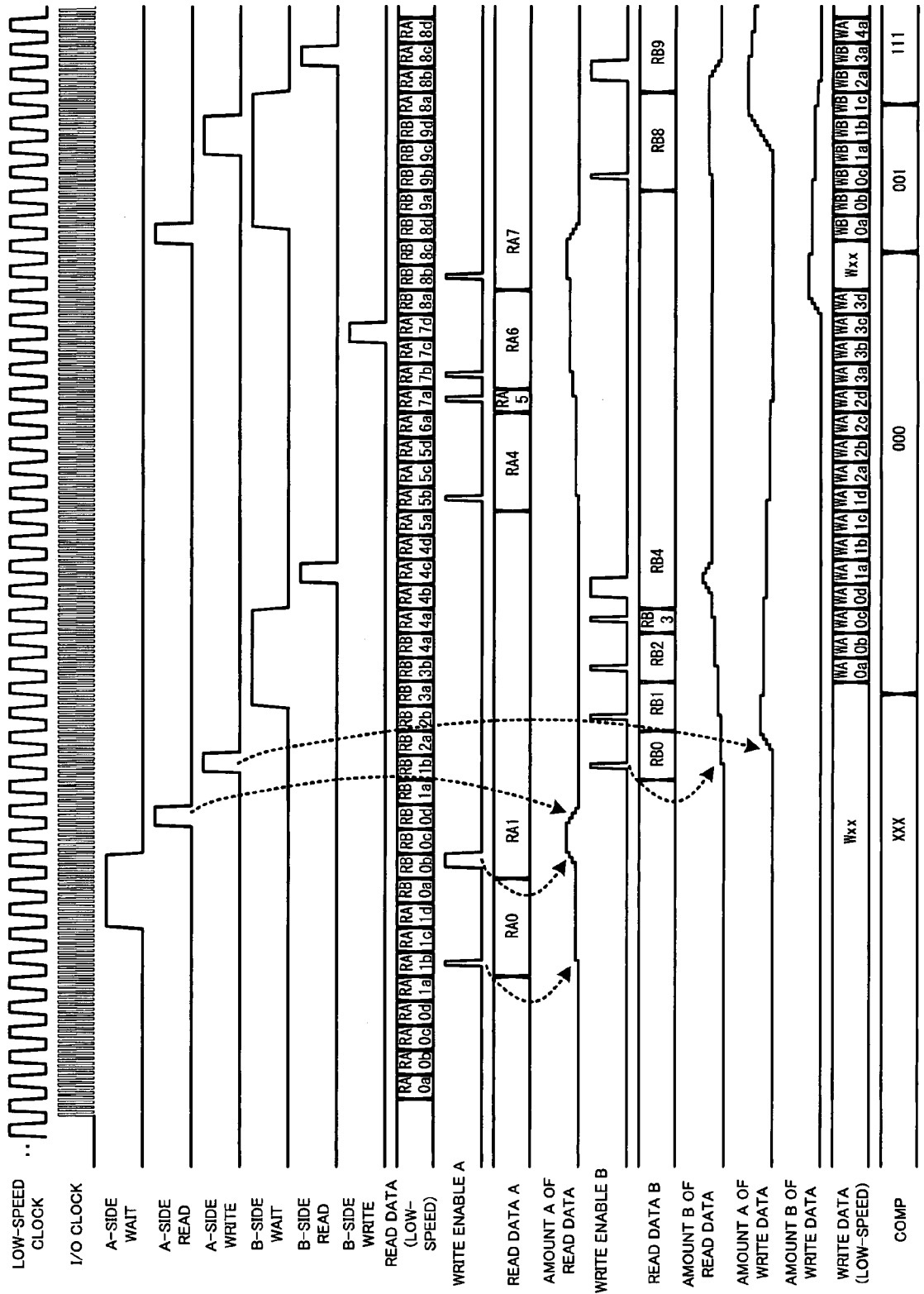
FIG. 18 shows waveforms indicative of the operation of the integrated circuit according to the seventh embodiment of the present invention.

FIG. 18 shows waveforms indicative of the operation of the integrated circuit according to the seventh embodiment of the present invention.

In FIG. 18, "A-side WAIT" indicates WAIT inputted to the external memory control circuit 11a, "A-side read" indicates that the test RAM 13b reads out data to the external memory control circuit 11a, "A-side write" indicates that the external memory control circuit 11a writes data to the test RAM 13a, "B-side WAIT" indicates WAIT inputted to the external memory control circuit 11b, "B-side read" indicates that the test RAM 13d reads out data to the external memory control circuit 11a, "B-side write" indicates that the external memory control circuit 11a writes data to the test RAM 13c, "write enable A" indicates a write permission signal by which the LSI tester 200 can write read data A to the test circuit 15c, the "read data A" indicates read data to be stored in the test RAM 13a, "amount A of read data" indicates the amount of read data stored in the test RAM 13a, "write enable B" indicates a write permission signal by which the LSI tester 200 can write the read data B to the test circuit 15c, "read data B" indicates read data to be stored in the test RAM 13c, "amount B of read data" indicates the amount of read data stored in the test RAM 13c, "amount A of write data" indicates the amount of write data stored in the test RAM 13b, and "amount B of write data" indicates the amount of write data stored in the test RAM 13d.

It is assumed that read data sent to the external memory control circuit 11a is RAn={RAnd, RAnc, RAnb, RAna}, that read data sent to the external memory control circuit 11b is RBn={RBnd, RBnc, RBnb, RBna}, that write data sent to the external memory control circuit 11a is WAn={WAnd, WAnc, WAnb, WAna}, and that write data sent to the external memory control circuit 11b is WBn={WBnd, WBnc, WBnb, WBna}.

In FIG. 18, the width of write enable is proportional to the number of written pieces of data which are the same. For example, RA1 is written three times and RB4 is written four times.

The operation of the integrated circuit 100e according to the seventh embodiment of the present invention is approximately the same as that of the integrated circuit 100d according to the fifth (sixth) embodiment of the present invention, so descriptions of the operation of the integrated circuit 100e according to the seventh embodiment of the present invention will be omitted.

The same effect that is obtained by the system according to the fifth embodiment of the present invention can be achieved by the system according to the seventh embodiment of the present invention.

A system according to an eighth embodiment of the present invention will now be described.

The differences between the systems according to the seventh and eighth embodiments of the present invention will mainly be described and descriptions of the same matters will be omitted.

Figure 19:
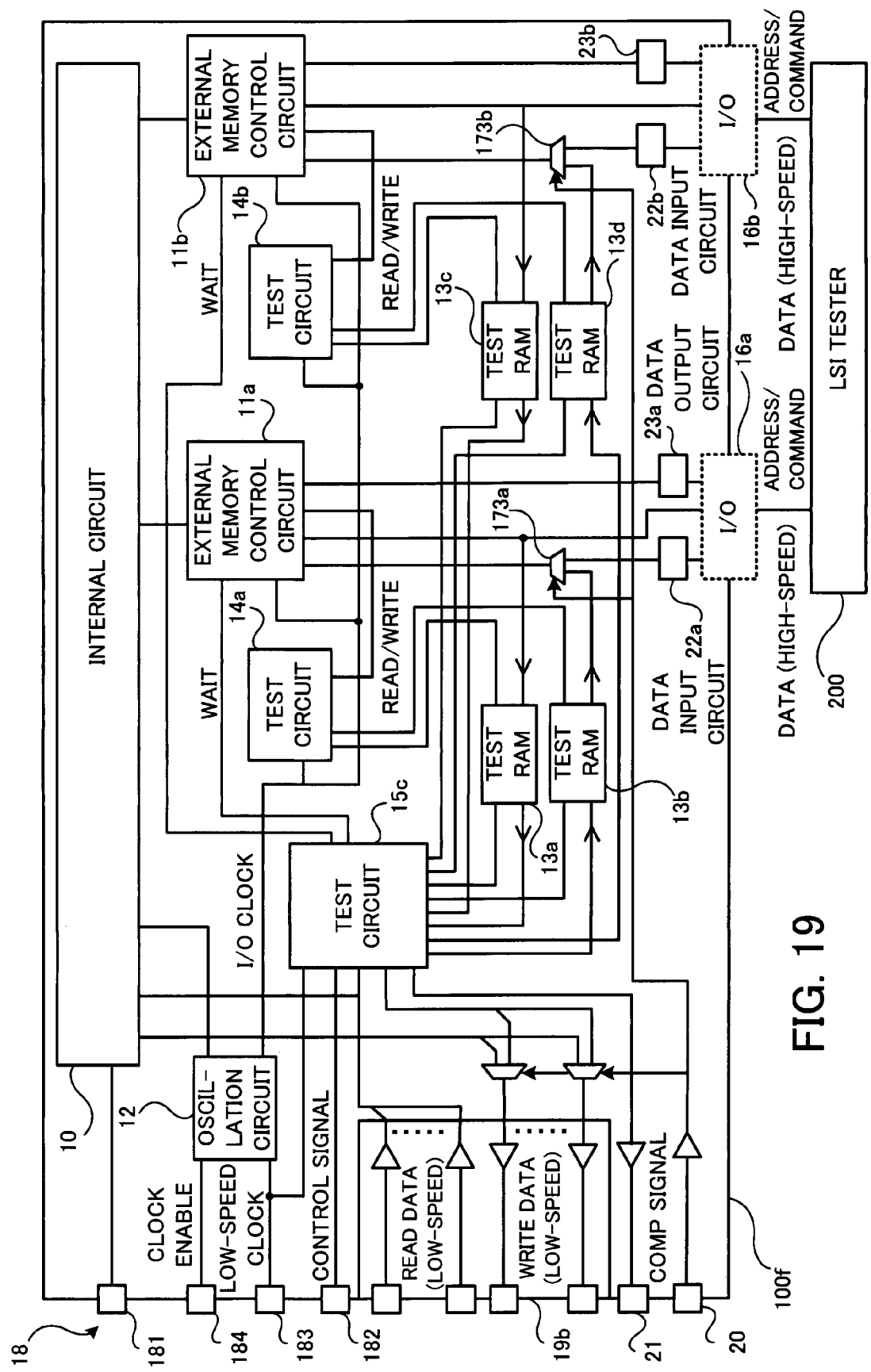
FIG. 19 is block diagram showing a system according to an eighth embodiment of the present invention.

FIG. 19 is block diagram showing the system according to the eighth embodiment of the present invention.

An integrated circuit 100f according to the eighth embodiment of the present invention can be applied to a case where a double data rate synchronous dynamic (DDRSD) RAM is used as an external memory.

The integrated circuit 100f includes a data input circuit 22a located between an input buffer included in an I/O 16a and a selector 173a, a data input circuit 22b located between an input buffer included in an I/O 16b and a selector 173b, a data output circuit 23a located between an external memory control circuit 11a and an output buffer included in the I/O 16a, and a data output circuit 23b located between an external memory control circuit 11b and an output buffer included in the I/O 16b. An I/O clock and a control signal (not shown) are inputted to each of the data input circuits 22a and 22b and the data output circuits 23a and 23b.

Figure 20:
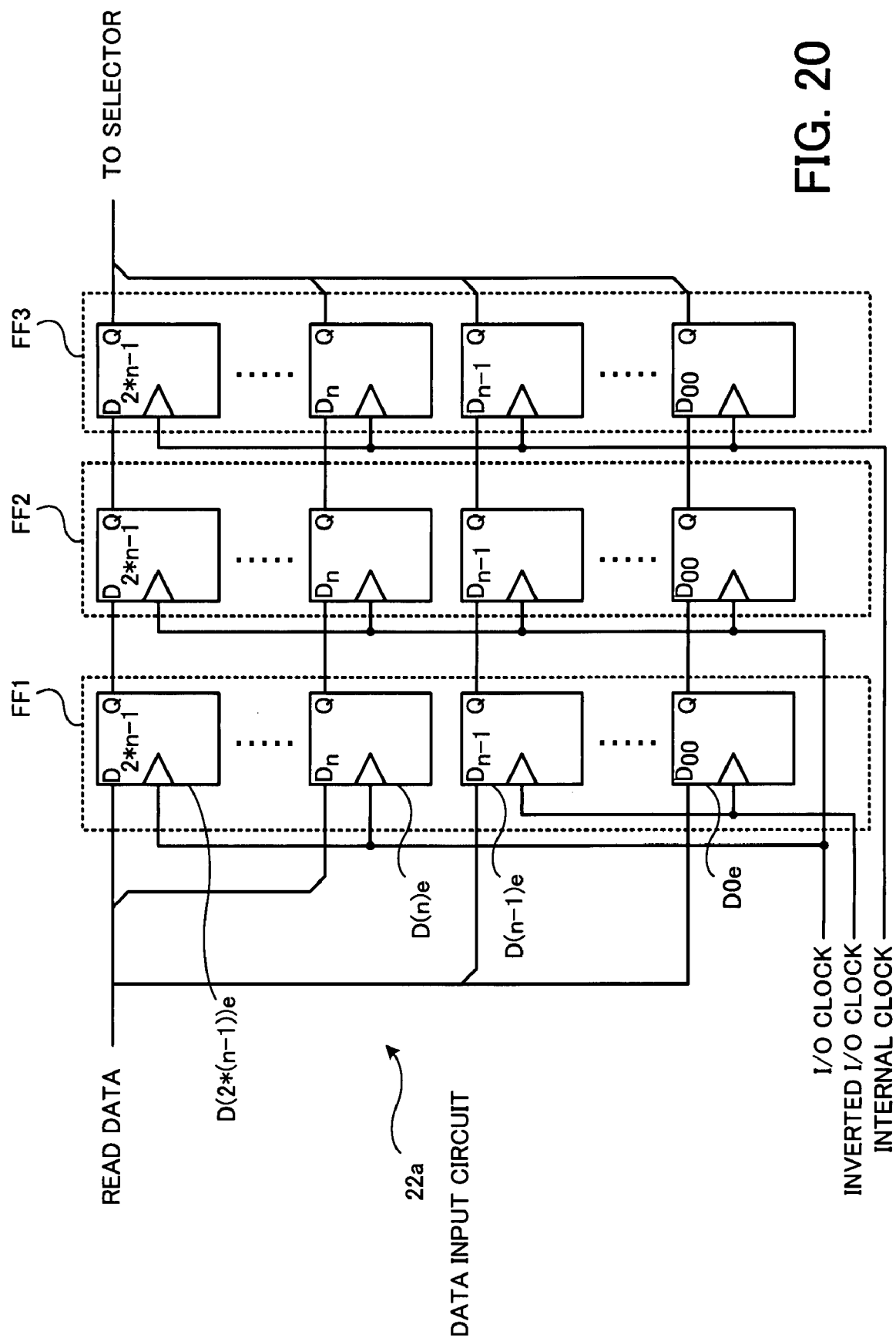
FIG. 20 shows a data input circuit included in an integrated circuit according to the eighth embodiment of the present invention.

FIG. 20 shows a data input circuit included in the integrated circuit according to the eighth embodiment of the present invention. The data input circuit 22a is shown in FIG. 20.

The data input circuit 22a includes flip-flop groups FF1 through FF3 each including a total of 2n D flip-flops. That is to say, each flip-flop group is made up of n D flip-flops D0e through D(n-1)e and n D flip-flops D(n)e through D(2(n-1))e.

The data input circuit 22a transfers data which synchronizes with the rise of an I/O clock and data which synchronizes with the rise of an inverted I/O clock.

First, read data inputted from an LSI tester 200 via the I/O 16a is latched by the flip-flop group FF1. The D flip-flops D0e through D(n-1)e latch the read data at the rise of the I/O clock and the D flip-flops D(n)e through D(2(n-1))e latch the read data at the rise of the inverted I/O clock.

The flip-flop group FF2 latches output from the flip-flop group FF1 at the next rise of the I/O clock.

The flip-flop group FF3 then latches output from the flip-flop group FF2 on the basis of an internal clock and outputs the read data to the selector 173a.

Figure 21:
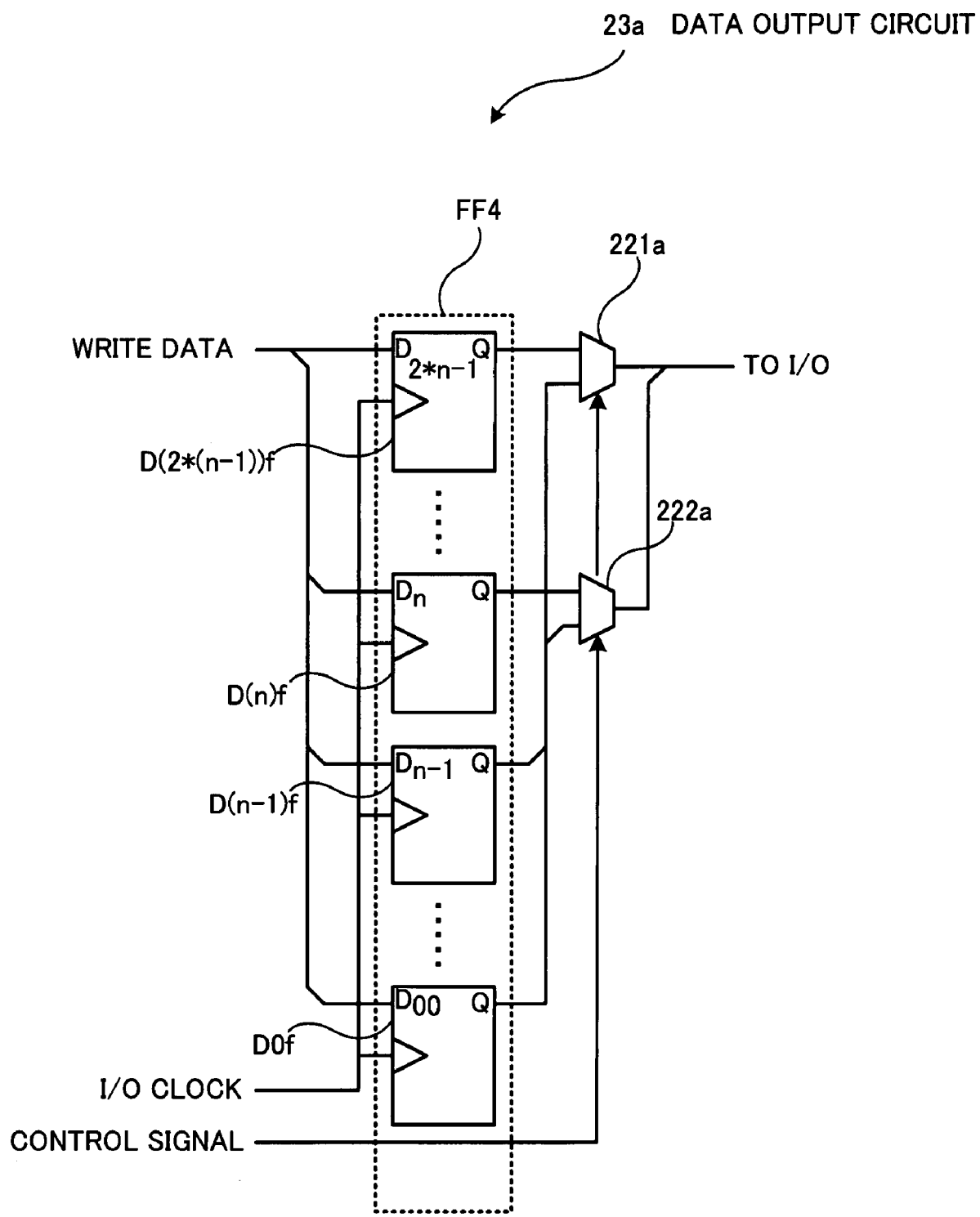
FIG. 21 shows a data output circuit included in the integrated circuit according to the eighth embodiment of the present invention.

FIG. 21 shows a data output circuit included in the integrated circuit according to the eighth embodiment of the present invention. The data output circuit 23a is shown in FIG. 21.

The data output circuit 23a includes a D flip-flop group FF4 including a total of 2n D flip-flops and selectors 221a and 222a located on the output side of the D flip-flop group FF4. The D flip-flop group FF4 includes n D flip-flops D0f through D(n-1)f and n D flip-flops D(n)f through D(2(n-1))f.

Write data inputted from the external memory control circuit 11a is latched by the D flip-flop group FF4 at the rise of a clock. Write data selected by a selection signal is outputted from the selectors 221a and 222a to the I/O 16a at the next rise of the clock.

The same effect that is obtained by the system according to the seventh embodiment of the present invention can be achieved by the system according to the eighth embodiment of the present invention. As stated above, the system according to the eighth embodiment of the present invention can also be applied to a case where a DDRSDRAM is used as an external memory.

A system according to a ninth embodiment of the present invention will now be described.

The differences between the systems according to the seventh and ninth embodiments of the present invention will mainly be described and descriptions of the same matters will be omitted.

Unlike the integrated circuit according to the seventh embodiment of the present invention, an integrated circuit according to the ninth embodiment of the present invention can also cope with a case where low-speed input and low-speed output of data cannot be performed at the same time because of the number of terminals which can be used for controlling low-speed data input-output being small. The structure of the integrated circuit according to the ninth embodiment of the present invention is the same as that of the integrated circuit 100e according to the seventh embodiment of the present invention.

Figure 22:
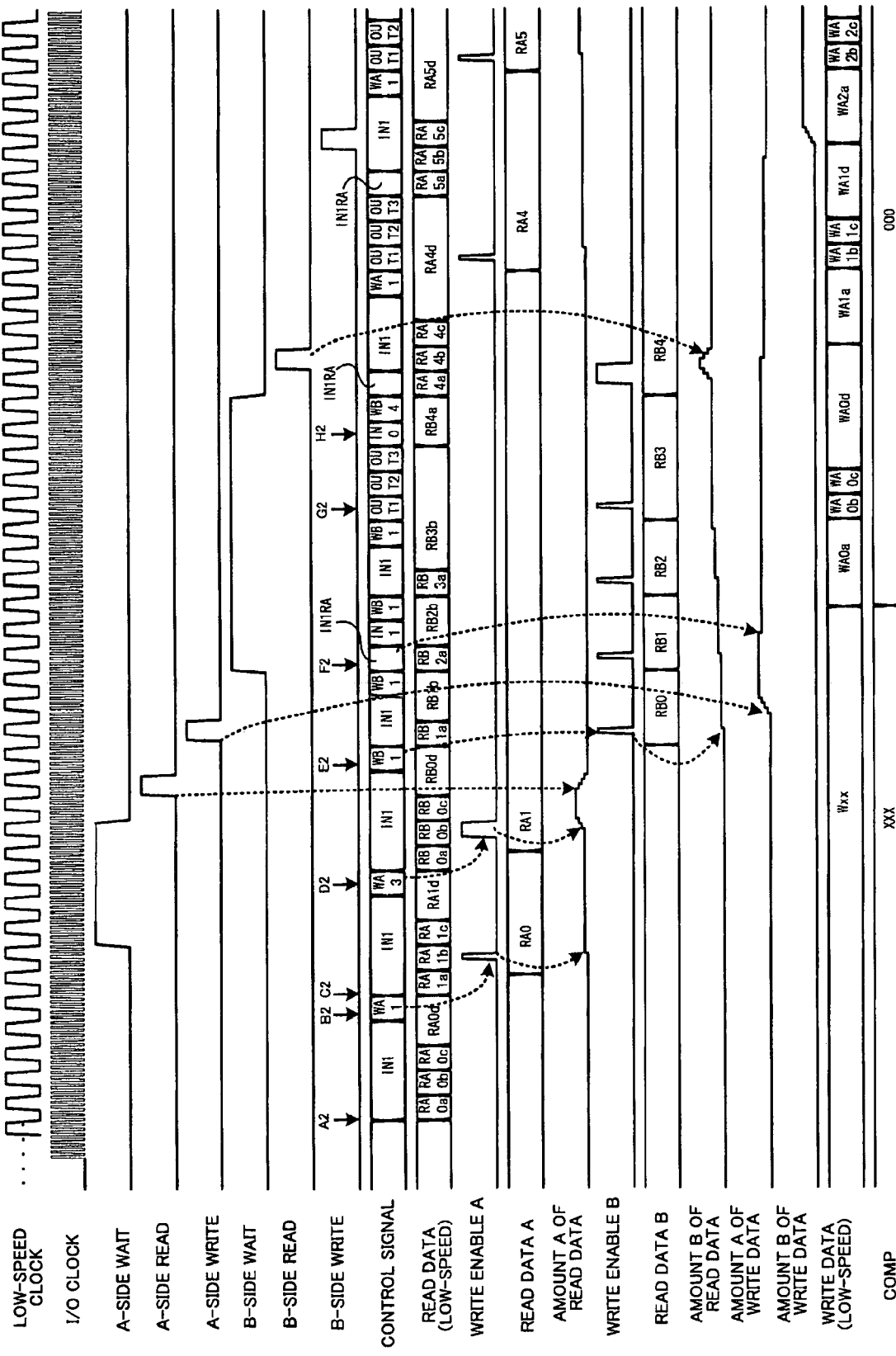
FIG. 22 shows waveforms indicative of the operation of an integrated circuit according to a ninth embodiment of the present invention.

FIG. 22 shows waveforms indicative of the operation of the integrated circuit according to the ninth embodiment of the present invention.

In FIG. 22, "control signal" indicates a control signal inputted to a test circuit 15c. The meanings of the control signal are as follows.

IN1: Read data is inputted at a low speed to a test RAM 13a or 13b in order sixteen bits at a time.

IN0: Write data c63 through c48 is inputted from an I/O 19b at a low speed and "0" is inputted to each selector in a low-speed data input circuit 151a.

WA1: One word is written to the test RAM 13a.

WA3: Three words are written to the test RAM 13a.

IN1RA: Read data is inputted at a low speed in order sixteen bits at a time and one word is read from the test RAM 13b.

OUT1: A low-speed data output circuit outputs write data c47 through C32 of low-speed write data read from the test RAM 13a.

OUT2: The low-speed data output circuit outputs write data c15 through C00 of low-speed write data read from the test RAM 13a.

OUT3: The low-speed data output circuit outputs write data c31 through C16 of low-speed write data read from the test RAM 13a.

The low-speed data output circuit always outputs write data c63 through C48 during a period other than OUT1 through OUT3.

The operation of the integrated circuit according to the ninth embodiment of the present invention will now be described. However, descriptions of the operation of the integrated circuit according to the ninth embodiment of the present invention which is the same as that of the integrated circuit 100d according to the fifth (sixth) embodiment of the present invention will be omitted.

The control signal IN1 is inputted first and read data RA0a through RA0d is inputted at a low speed to the test RAM 13a in order sixteen bits at a time (time A2).

The control signal WA1 is then inputted and read data RA0 for one word, that is to say, the read data RA0a through RA0d is written to the test RAM 13a at a low speed (time B2).

The control signal IN1 is then inputted and read data RA1a through RA1d is inputted at a low speed to the test RAM 13a in order sixteen bits at a time (time C2).

The control signal WA3 is then inputted and read data RA1 for three words, that is to say, the read data RA1a through RA1d for three words is written to the test RAM 13a at a low speed (time D2).

The control signal WB1 is then inputted and read data RB0 for one word, that is to say, read data RB0a through RB0d is written to a test RAM 13c at a low speed (time E2).

After that, processes are performed in order. The control signal IN1RA is inputted (time F2). As a result, read data is inputted at a low speed in order sixteen bits at a time and one word is read from the test RAM 13b.

The control signal OUT1 is then inputted (time G2) and write data b47 through b32 is outputted from the low-speed data output circuit 152a.

The control signal IN0 is then inputted (time H2). As a result, "0" is inputted to each selector in the low-speed data input circuit 151a and write data b63 through b48 is inputted from an I/O 16a at a low speed.

After that, operation is performed in the same way.

The same effect that is obtained by the system according to the seventh embodiment of the present invention can be achieved by the system according to the ninth embodiment of the present invention.

The system according to the ninth embodiment of the present invention can also cope with a case where low-speed input and low-speed output of data cannot be performed at the same time because of the number of terminals which can be used for controlling low-speed data input-output being small by changing the pattern of inputting control signals.

A system according to a tenth embodiment of the present invention will now be described.

The differences between the systems according to the fifth and tenth embodiments of the present invention will mainly be described and descriptions of the same matters will be omitted.

An integrated circuit 100g according to the tenth embodiment of the present invention differs from the integrated circuit 100d according to the fifth embodiment of the present invention in that an external memory control circuit 11 is in a wait state (by WAIT) by default.

Figure 23:
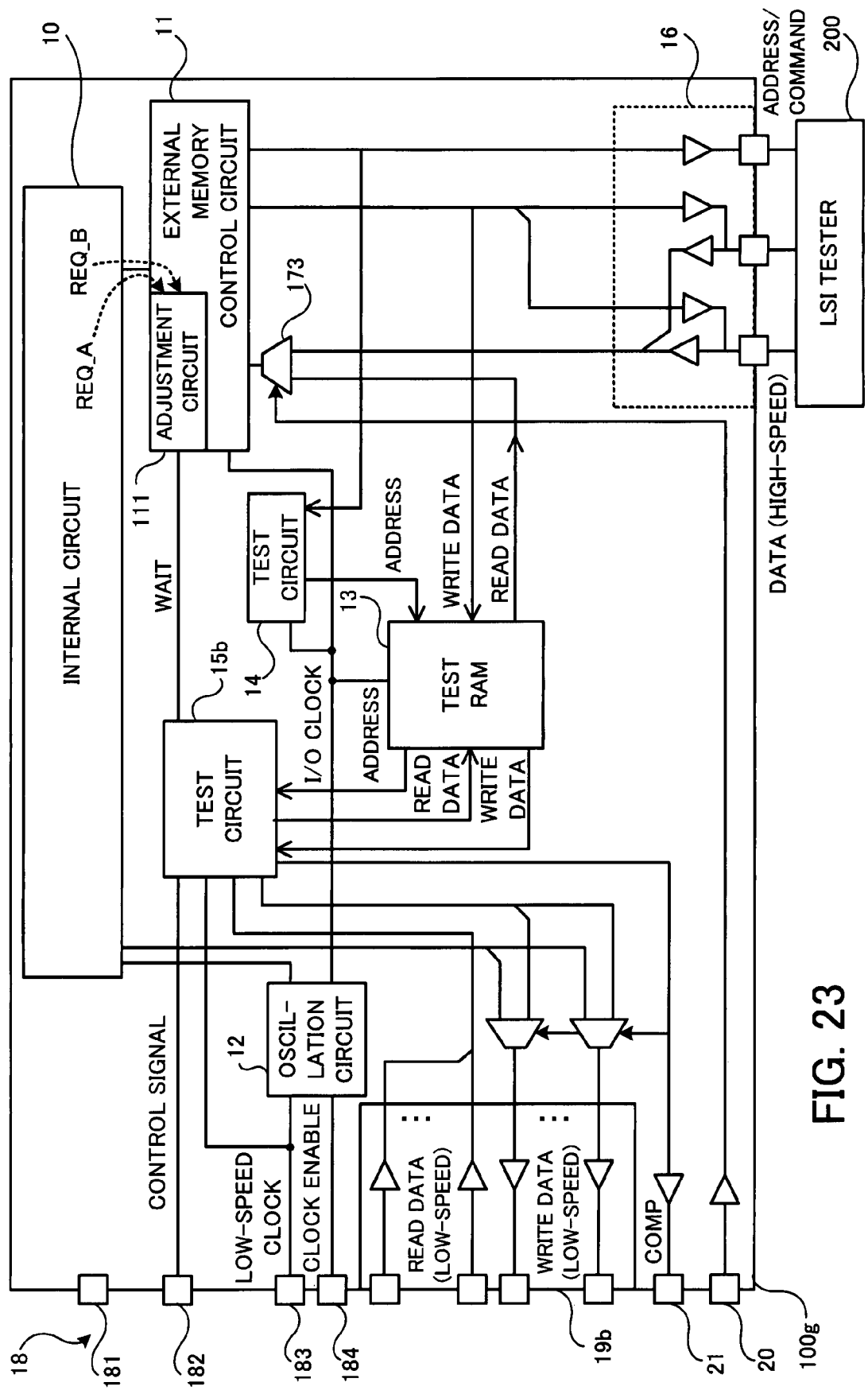
FIG. 23 is block diagram showing a system according to a tenth embodiment of the present invention.

FIG. 23 is block diagram showing a system according to the tenth embodiment of the present invention.

The integrated circuit 100g according to the tenth embodiment of the present invention includes an adjustment circuit 111 for managing a plurality of requests from an internal circuit 10 to access a test RAM 13 (REQ_A and REQ_B in this example).

An LSI tester 200 sets the external memory control circuit 11 to a wait state (by WAIT) via a test circuit 15b by default.

Figure 24:
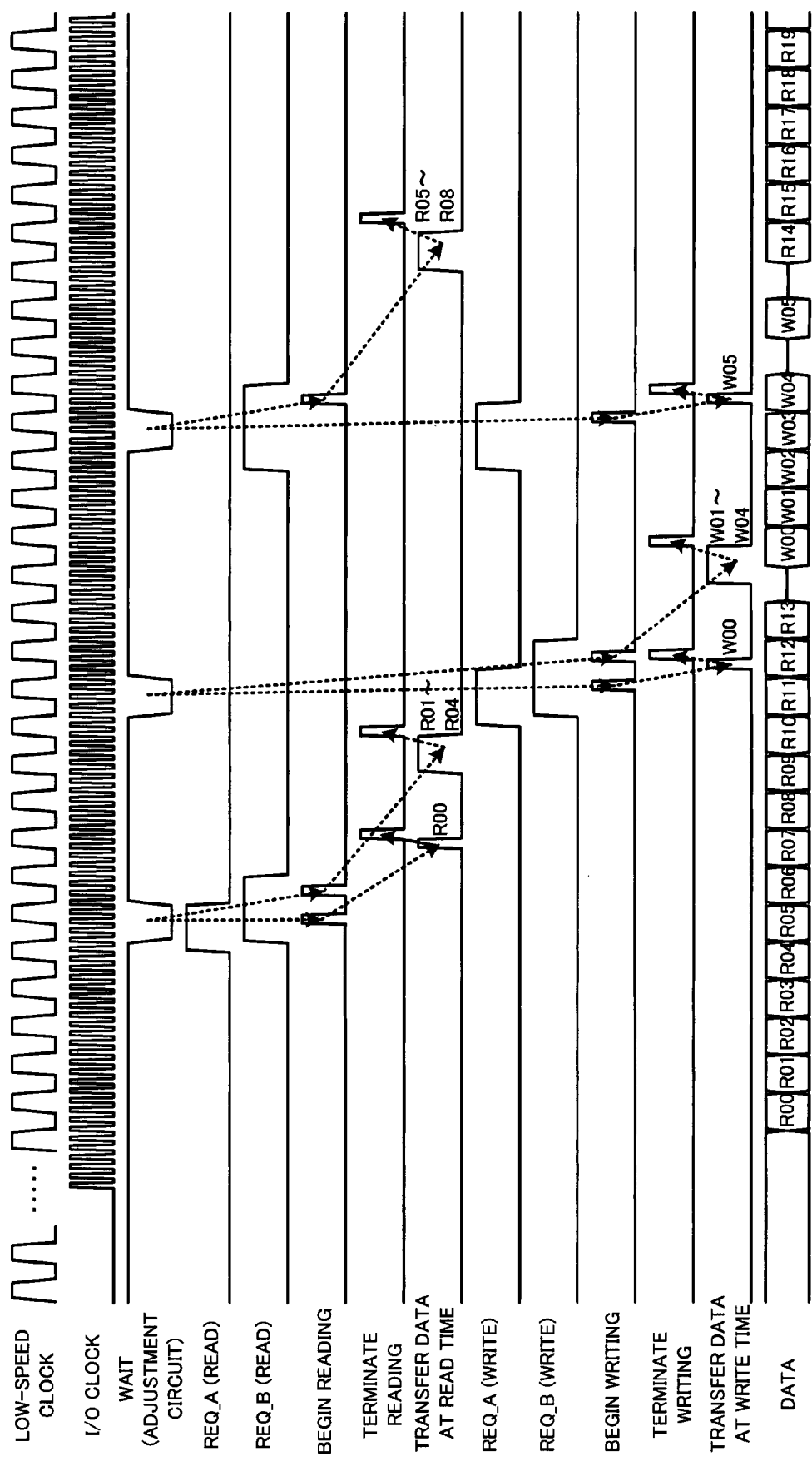
FIG. 24 shows waveforms indicative of the operation of an integrated circuit according to the tenth embodiment of the present invention.

FIG. 24 shows waveforms indicative of the operation of the integrated circuit according to the tenth embodiment of the present invention. In FIG. 24, "WAIT (ADJUSTMENT CIRCUIT)" indicates a signal outnut from the adjustment circuit 111 that received a signal outnut from the LSI tester 200 via the test circuit 15b. "REQ_A (read)" and "REQ_B (read)" indicate read access requests from the internal circuit 10, "begin reading," "terminate reading," and "transfer data at read time" indicate operation performed by the external memory control circuit 11, "REQ_A (write)" and "REQ_B (write)" indicate read access requests from the internal circuit 10, and "begin writing," "terminate writing," and "transfer data at write time" indicate operation performed by the external memory control circuit 11.

In FIG. 24, when the external memory control circuit 11 reads read data, necessary data is written to a write data area of the test RAM 13. When the external memory control circuit 11 writes write data, the wait state of the external memory control circuit 11 is released and the external memory control circuit 11 is set to a wait state after one low-speed clock pulse. This is based on the assumption that there is sufficient space in the write data area of the test RAM 13. An external memory access may occur twice during the one low-speed clock pulse during which the wait state of the external memory control circuit 11 is released.

The same effect that is obtained by the system according to the fifth embodiment of the present invention can be achieved by the system according to the tenth embodiment of the present invention.

With the system according to the tenth embodiment of the present invention, the next access begins before the preceding memory access terminates. This increases efficiency in external memory access. Moreover, depending on the structure of the external memory control circuit 11 or the type of an external memory, it is possible to overlap memory access operations. For example, if the external memory is an SDRAM and different banks are accessed, a bank can be made active for the next memory access during read/write.

A system according to an eleventh embodiment of the present invention will now be described.

The differences between the systems according to the tenth and eleventh embodiments of the present invention will mainly be described and descriptions of the same matters will be omitted.

With the integrated circuit 100g according to the tenth embodiment of the present invention the external memory control circuit 11 is always in a wait state (by WAIT) so that external memory accesses will not overlap. The wait state of the external memory control circuit 11 is released only during one low-speed clock pulse. However, if the speed of an internal clock is high, two memory accesses may occur. An integrated circuit according to the eleventh embodiment of the present invention differs from the integrated circuit 100g according to the tenth embodiment of the present invention in that the occurrence of two memory accesses is prevented.

Figure 25:
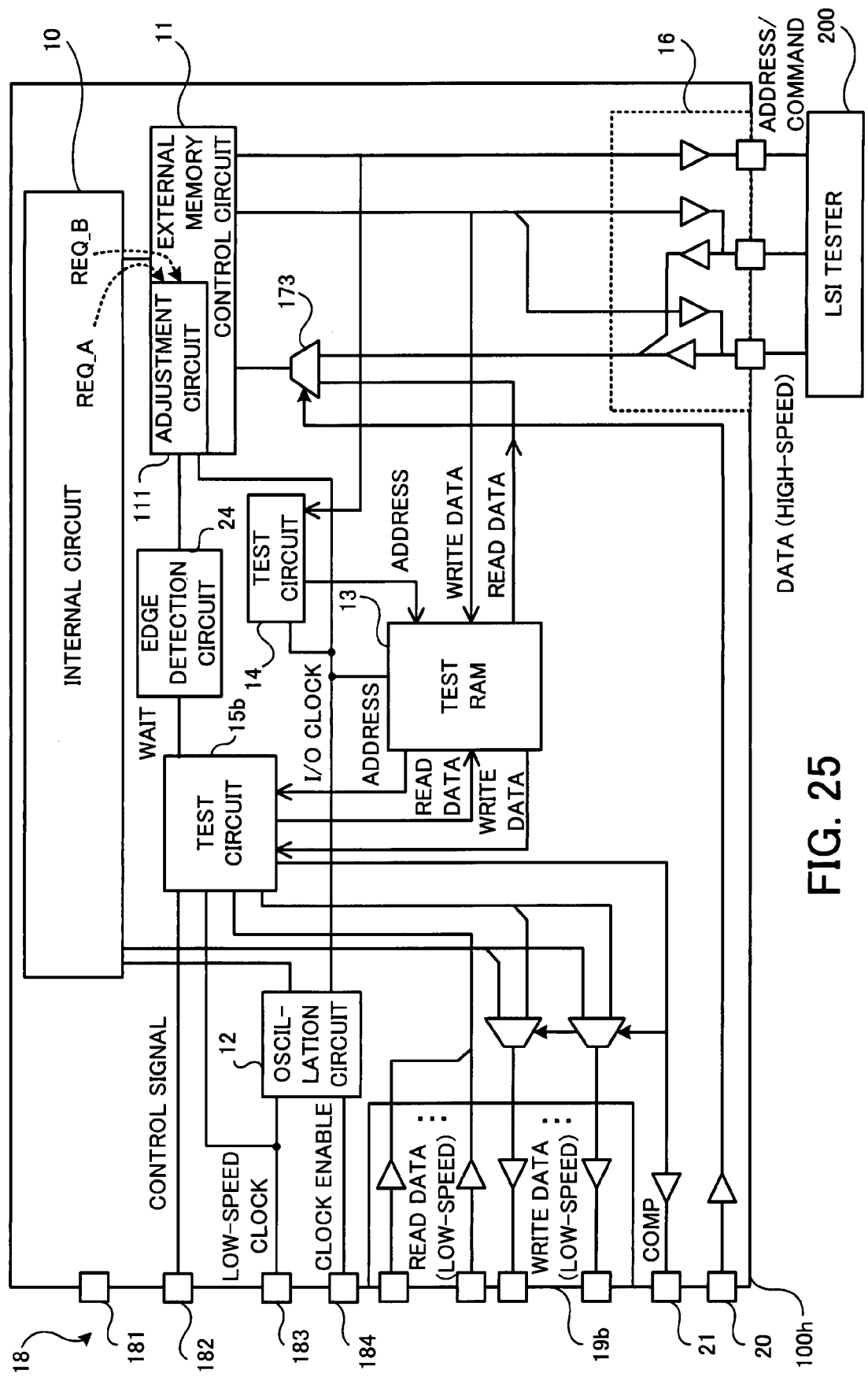
FIG. 25 is block diagram showing a system according to an eleventh embodiment of the present invention.

FIG. 25 is block diagram showing the system according to the eleventh embodiment of the present invention.

To prevent the occurrence of two memory accesses, an integrated circuit 100h according to the eleventh embodiment of the present invention includes an edge detection circuit 24 for detecting the trailing edge of a WAIT signal.

When the edge detection circuit 24 detects the trailing edge of a WAIT signal, the edge detection circuit 24 outputs an edge pulse for releasing the wait state of an external memory control circuit 11 during one I/O clock pulse to the external memory control circuit 11. If a clock for an adjustment circuit 111 included in the external memory control circuit 11 differs from an I/O clock, then the wait state of the external memory control circuit 11 is released during one pulse of the clock for the adjustment circuit 111.

Figure 26:
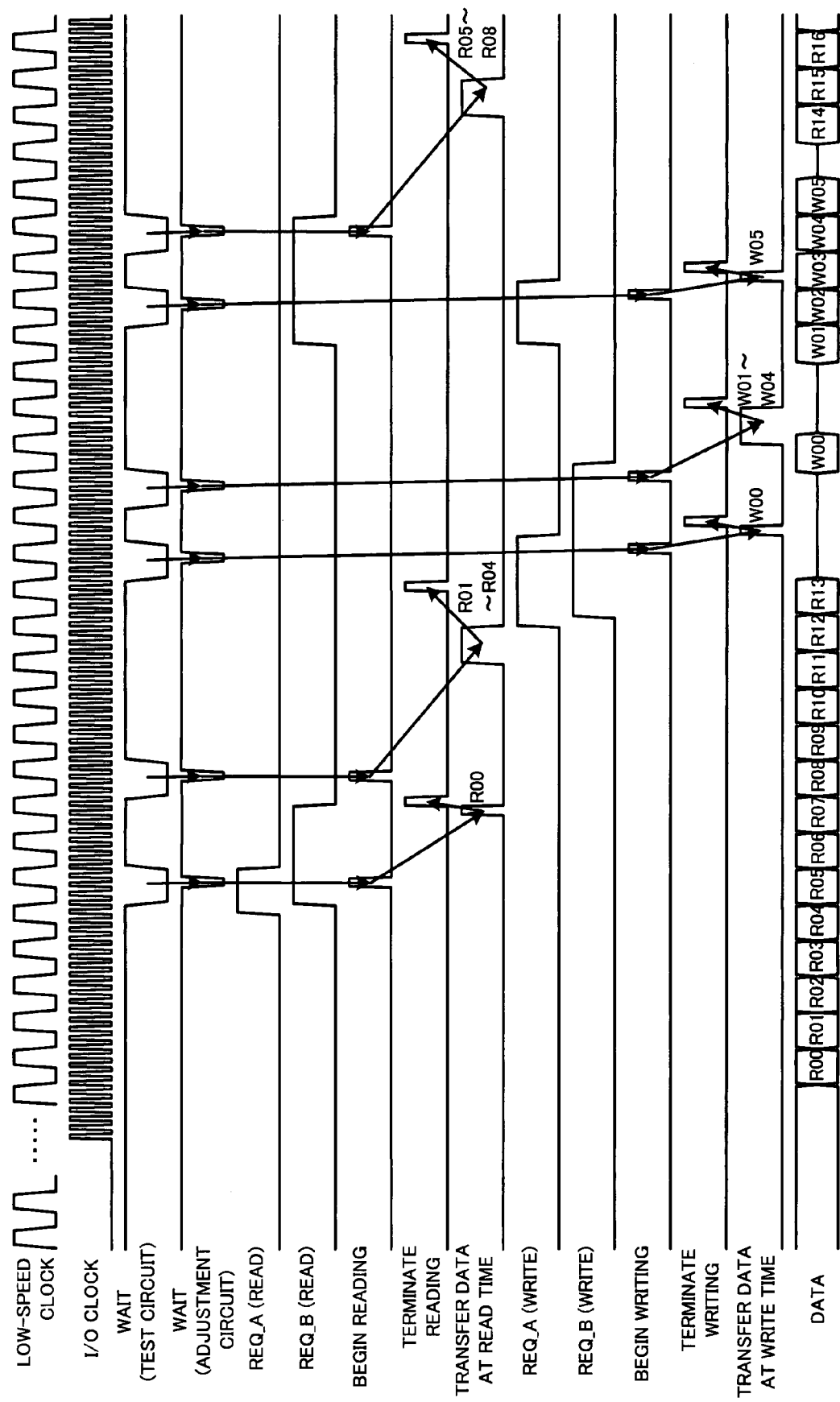
FIG. 26 shows waveforms indicative of the operation of an integrated circuit according to the eleventh embodiment of the present invention.
Figure 27:
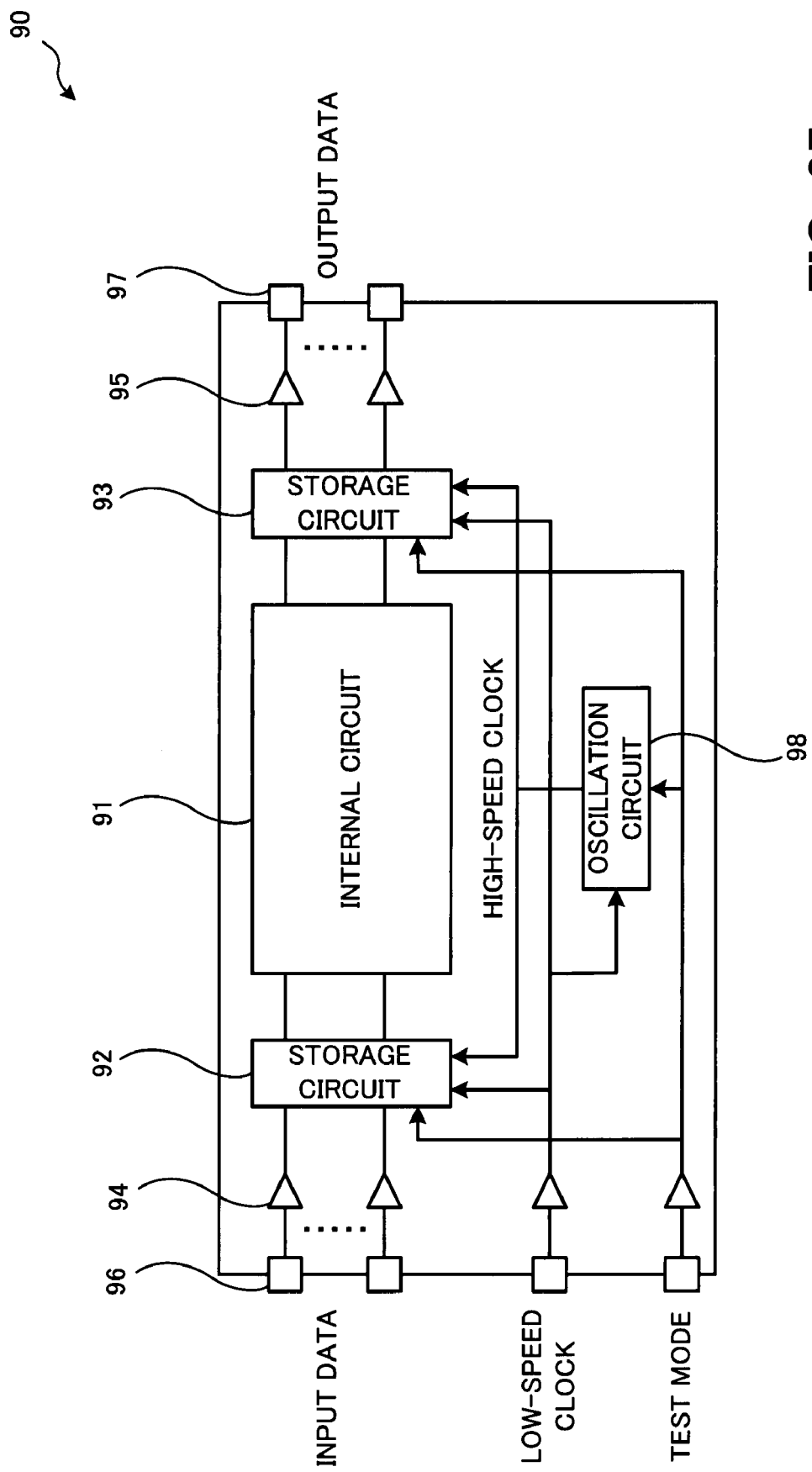
FIG. 27 is a block diagram showing a conventional system for testing a semiconductor integrated circuit.
Figure 28:
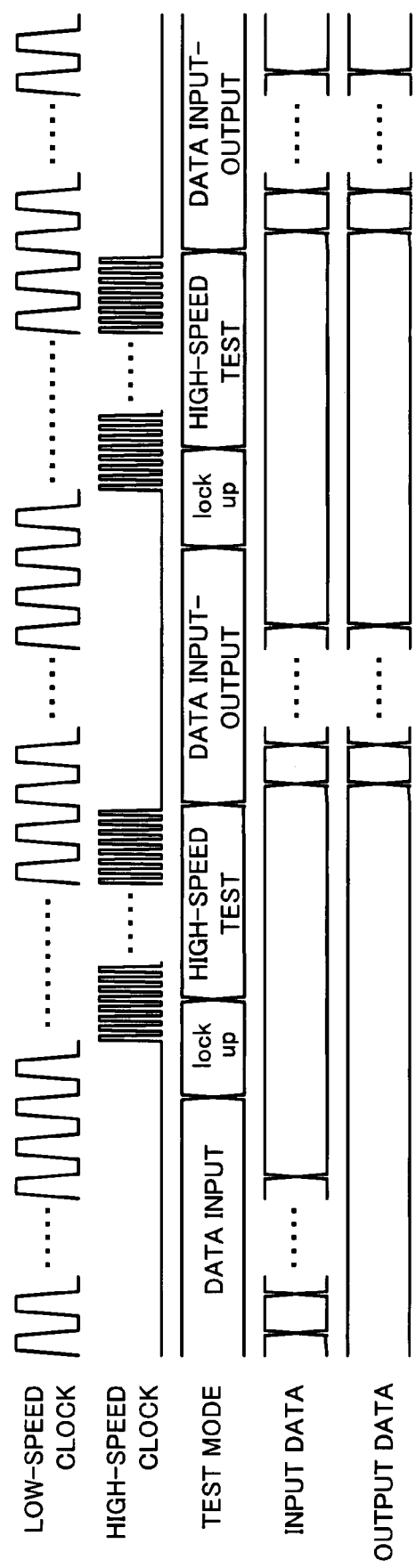
FIG. 28 shows waveforms indicative of the operation of the conventional system.

FIG. 26 shows waveforms indicative of the operation of the integrated circuit according to the eleventh embodiment of the present invention.

In FIG. 26, "WAIT (TEST CIRCUIT)" indicates a signal output from the test circuit 15b.

For one edge pulse outputted from the edge detection circuit 24, the wait state of the external memory control circuit 11 is released during one clock pulse. Accordingly, an external memory access occurs only once. As a result, the timing of the external memory access can be controlled reliably by a control signal inputted to a test circuit 15b. This is effective especially in the case where the amount of data included in the longest burst of an external memory access is approximately the same as the capacity of a test RAM 13. It is assumed that the preceding write (or read) and longest-burst write (or read) overlap. With the integrated circuit 100g according to the tenth embodiment of the present invention the test RAM 13 overflows with write data (or the capacity of the test RAM 13 runs short). With the integrated circuit 100h according to the eleventh embodiment of the present invention, however, the test RAM 13 does not overflow with data (or the capacity of the test RAM 13 does not run short). In addition, a test circuit or a test signal generation simulation can be debugged easily.

In the present invention the command interpretation circuit interprets a command issued by the control circuit and a data transfer is performed between the test storage section and the circuit only at the time of inputting or outputting necessary data. As a result, test time can be reduced significantly. In addition, there is no need to read useless data. Therefore, the size of the test storage section can be reduced and the size of the integrated circuit can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An integrated circuit capable of verifying an operation speed of a circuit, the integrated circuit comprising:
   an internal circuit to be tested;
   a control circuit, located between the internal circuit and a large-scale integration (LSI) tester, to input read data to the internal circuit from the LSI tester by the use of a read command and to output write data outputted from the internal circuit to the LSI tester by the use of a write command;
   a test storage section including a read data storage section to store for the read data inputted at a low speed and a write data storage section to store the write data outputted from the control circuit;
   a command interpretation circuit to interpret the read command and the write command issued by the control circuit, to supply, at the time of determining that the read data must be inputted to the control circuit, the read data from the test storage section to the control circuit at a high speed, and to supply, at the time of determining that the write data is outputted from the control circuit, the write data outputted from the control circuit to the test storage section at a high speed;
   an input circuit to input the read data inputted from the LSI tester to the test storage section at a low speed; and
   an output circuit to output the write data supplied to the test storage section to the LSI tester at a low speed.

2. The integrated circuit according to claim 1, wherein:
   input of the read data and output of the write data are performed between the command interpretation circuit and the test storage section;
   the input circuit inputs the read data to the test storage section; and
   the output circuit outputs the write data to the LSI tester.

3. The integrated circuit according to claim 1, wherein the input circuit is integrated with the output circuit.

4. The integrated circuit according to claim 1, wherein the LSI tester inputs a low-speed clock for operation to the input circuit and the output circuit and inputs a clock for operation having a speed higher than a speed of the low-speed clock to the command interpretation circuit.

5. The integrated circuit according to claim 1, further comprising:
   a data input-output section to perform direct input-output of data between the control circuit and the LSI tester; and
   a low-speed data input-output section to perform input-output of data between the control circuit and the LSI tester via the test storage section,
   wherein the data input-output section and the low-speed data input-output section are separately provided.

6. The integrated circuit according to claim 5, further comprising:
   a conversion circuit to convert bit width of data inputted to and outputted from the low-speed data input-output section and bit width of data inputted to and outputted from the test storage section.

7. The integrated circuit according to claim 6, wherein the conversion circuit is located between the test storage section and the LSI tester, includes a comparison circuit to determine, by comparison, whether plural pieces of write data outputted from the test storage section are the same, and to output, in the case of the plural pieces of write data being the same, one of the plural pieces of write data and a result obtained by the comparison to the low-speed data input-output section.

8. The integrated circuit according to claim 1, wherein the LSI tester is a tester for verifying an operation speed of the integrated circuit.

9. The integrated circuit according to claim 1, further comprising:
a selector to switch between the read data directly inputted from the LSI tester to the control circuit and the read data inputted via the test storage section.

10. The integrated circuit according to claim 1, further comprising:
a selector to switch between the write data directly outputted from the control circuit to the LSI tester and the write data outputted via the test storage section.

11. The integrated circuit according to claim 1, wherein the LSI tester operates the input circuit so as to input the read data to the test storage section at a low speed according to timing at which the command interpretation circuit outputs the read command.

12. The integrated circuit according to claim 1, wherein the LSI tester operates the output circuit so as to output the write data from the test storage section at a low speed according to timing at which the command interpretation circuit outputs the write command.

* * * * *